(12) United States Patent
Dijaili et al.

(10) Patent No.: US 6,707,600 B1
(45) Date of Patent: Mar. 16, 2004

(54) EARLY WARNING FAILURE DETECTION FOR A LASING SEMICONDUCTOR OPTICAL AMPLIFIER

(75) Inventors: Sol P. Dijaili, Moraga, CA (US); Jeffrey D. Walker, El Cerrito, CA (US); Mark V. Schnittker, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 92 days.

(21) Appl. No.: 10/029,676

(22) Filed: Dec. 21, 2001

Related U.S. Application Data

(60) Provisional application No. 60/274,470, filed on Mar. 9, 2001.

(51) Int. Cl.[7] .................................................. H01S 3/00
(52) U.S. Cl. ........................... 359/344; 359/337; 372/43
(58) Field of Search ................................ 359/344, 337; 372/43

(56) References Cited

U.S. PATENT DOCUMENTS

| | | | |
|---|---|---|---|
| 3,467,906 A | 9/1969 | Cornely et al. ............... | 330/4.3 |
| 3,828,231 A | 8/1974 | Yamamoto .................... | 357/30 |
| 5,436,759 A | 7/1995 | Dijaili et al. ................ | 359/333 |
| 6,577,654 B1 * | 6/2003 | Dijaili et al. .................. | 372/20 |

FOREIGN PATENT DOCUMENTS

WO    WO 03/021733 A1 * 3/2003

OTHER PUBLICATIONS

Alcatel, "Alcatel Optronics Introduces a Gain–Clamped Semiconductor Optical Amplifier," *Press Release for Immediate Publication*, OFC '98, San Jose, 1 unnumbered page, (Feb. 1998).

Dorgeuille, F., Lavigne, B., Emery, J.Y., Di Maggio, M., Le Bris, J., Chiaroni, D., Renaud, M., Baucknecht, R., Schneibel, H.P., Graf, C., and Melchior, H., "Fast Optical Amplifier Gate Array for WDM Routing and Switching Applications," OFC '98 Technical Digest, pp. 42–44, 1998.

Dorgeuille, F., Noirie, L., Faure, J–P., Ambrosy, A., Rabaron, S., Boubal, F., Schilling, M., and Artigue, C., "1.28 Tbit/s Throughput 8×8 Optical Switch Based on Arrays of Gain–Clamped Semiconductor Optical Amplifier Gates," Optical Fiber Communication Conference, vol. 4, pp. 221–223, Mar. 2000.

Doussiere, P., Jourdan, A., Soulage, G., Garabédian, P., Graver, C., Fillion. T., Derouin, E., and Leclerc, D., "Clamped Gain Travelling Wave Semiconductor Optical Amplifier for Wavelength Division Multiplexing Application," IEEE, US, vol. Conf. 14, pp. 185–186, New York, Sep. 14, 1994.

McAdams, L.R., Weverka, R.T., and Cloonan, J., "Linearizing High Performance Semiconductor Optical Amplifiers: Techniques and Performance," LEOS Presentation, pp. 363–364, 1996.

Mutalik, V. G., van den Hoven, G., and Tiemeijer, L., "Analog Performance of 1310–nm Gain–Clamped Semiconductor Optical Amplifiers," OFC '97 Technical Digest, pp. 266–267, 1997.

(List continued on next page.)

Primary Examiner—Mark Hellner
(74) Attorney, Agent, or Firm—Workman Nydegger

(57) ABSTRACT

Early warning failure detetection is provided for an optical amplifier. The optical amplifier is based on a lasing semiconductor optical amplifier, which generates a ballast laser signal in addition to the amplified optical signal. The ballast laser signal exhibits a wavelength shift before failure and this wavelength shift is used as the basis for an early warning of future failure of the amplifier.

37 Claims, 19 Drawing Sheets

OTHER PUBLICATIONS

Soulage, G., Doussière, P., Jourdan, A., and Sotom, M., "Clamped Gain Travelling Wave Semiconductor Optical Amplifier as a Large Dynamic Range Optical Gate," Alcatel Alsthom Recherche, route de Nozay, 91460 Marcoussis (France), 4 unnumbered pages, undated.

Tiemeijer, L.F., Thijs, P.J.A., Dongen, T.v., Binsma, J.J.M., Jansen, E.J., van Helleputte, H.R.J.R., "Reduced Intermodulation Distortion in 1300 nm Gain–Clamped MQW Laser Amplifiers," IEEE Photonics Technology Letters, vol. 7, No. 3, pp. 284–286, Mar. 1995.

Tiemeijer, L.F., Walczyk, S., Verboven, A.J.M., van den Hoven, G.N., Thijs, P.J.A., van Dongen, T., Binsma, J.J.M., and Jansen, E.J., "High–Gain 1310 nm Semiconductor Optical Amplifier Modules with a Built–in Amplified Signal Monitor for Optical Gain Control," IEEE Photonics Technology Letters, vol. 9, No. 3, pp. 309–311, Mar. 1997.

Toptchiyski, G., Kindt, S., and Petermann, K., "Time–Domain Modeling of Semiconductor Optical Amplifiers for OTDM Applications," IEEE Journal of Lightwave Technology, vol. 17, No. 12, pp. 2577–2583, Dec. 1999.

\* cited by examiner

EARLY WARNING FAILURE DETECTION FOR A LASING SEMICONDUCTOR OPTICAL AMPLIFIER

CROSS-REFERENCE TO RELATED APPLICATION

This application claims priority under 35 USC 119(e) from U.S. Provisional Patent Application Ser. No. 60/274,470, "Early Warning Failure Detection within an Optical Network," by Sol P. Dijaili and Jeffrey D. Walker, filed Mar. 9, 2001, which subject matter is incorporated herein by reference.

BACKGROUND OF THE INVENTION

1. Field of the Invention

This invention generally relates to early warning failure detection for optical amplifiers. More particularly, it relates to early warning failure detection for lasing semiconductor optical amplifiers, such as vertical lasing semiconductor optical amplifiers (VLSOAs), where the failure detection is based on detecting a shift in wavelength of a ballast laser signal generated by the amplifier.

2. Description of the Related Art

Optical amplifiers are a basic building block for many types of optical systems. For example, fiber optic communications systems transmit information over optical fibers. A typical communications system includes a transmitter, an optical fiber, and a receiver. The transmitter incorporates information to be communicated into an optical signal and transmits the optical signal via the optical fiber to the receiver. The receiver recovers the original information from the received optical signal. In these systems, phenomena such as fiber losses, losses due to insertion of components in the transmission path, and splitting of the optical signal may attenuate the optical signal and degrade the corresponding signal-to-noise ratio as the optical signal propagates through the communications system. Optical amplifiers are used to compensate for these attenuations. As another example, receivers typically operate properly only within a relatively narrow range of optical signal power levels; optical amplifiers may be used to boost an optical signal to the proper power range for the receiver.

It is generally beneficial to monitor optical amplifiers to ensure that they are operating correctly. For example, one factor in the efficient utilization of an optical network is the ability to detect and correct failures within the network. Monitoring of optical amplifiers in the network can help locate a point of failure. Early warning before failures occur would also be beneficial, as this can be used to prevent failures; optical amplifiers which are identified as subject to failure in the near future can be replaced before they actually fail.

One method typically used to monitor an optical amplifier is based on tapping a small portion of the amplified optical signal leaving the optical amplifier. If the strength of the tapped portion falls within a specified range, this is an indication that the optical amplifier is operating correctly (or at least outputting a signal). In contrast, if the tapped portion is unusually weak or non-existent, this suggests that the optical amplifier may have failed. However, this approach reduces the optical signal's strength since a portion of the optical signal is tapped for monitoring purposes. As optical networks expand and the number of amplifiers in a signal path increases, the cumulative effect of all of these tap losses can be significant. Another drawback to this approach is that it does not provide early warning of a future failure.

As a result, there is a need for a failure detection capability for optical amplifiers which does not introduce tap loss or other types of optical loss. There is also a need for a failure detection capability which provides early warning of failures. In the context of optical communications systems, early warning failure detection would allow re-routing of data traffic away from optical amplifiers before they fail. Additionally, early warnings provide more time for a network manager to replace a failed (or about to fail) optical amplifier.

SUMMARY OF THE INVENTION

In accordance with the present invention, early warning failure detection is provided for an optical amplifier. The optical amplifier is based on a lasing semiconductor optical amplifier, which generates a ballast laser signal in addition to the amplified optical signal. The ballast laser signal exhibits a wavelength shift before failure and this wavelength shift is used as the basis for an early warning of future failure of the amplifier.

In one embodiment, the optical amplifier with early warning failure detection includes a lasing semiconductor optical amplifier coupled to a wavelength-sensitive detector. The lasing semiconductor optical amplifier includes a semiconductor gain medium, an amplifying path which traverses the semiconductor gain medium, a laser cavity which includes the semiconductor gain medium, and a pump input to the semiconductor gain medium. When the semiconductor gain medium is pumped above threshold for the laser cavity, the laser cavity generates a laser output (i.e., the ballast laser signal) which acts as a ballast for the amplification process. Early warning failure detection is based on detecting a wavelength shift in the ballast laser signal. The wavelength-sensitive detector receives the ballast laser signal for this purpose.

In one implementation, the lasing semiconductor optical amplifier is a vertical lasing semiconductor optical amplifier (VLSOA). In another aspect of the invention, early warning of failure is indicated by a shift to a longer wavelength. In yet another aspect, the wavelength-sensitive filter is implemented as an optical filter followed by a detector. For example, the pre-shift version of the ballast laser signal may fall in the stop band of the optical filter and the post-shift version in the pass band, or vice versa. In yet another variation, a VLSOA, optical filter and detector are implemented as layers of different materials stacked on a common substrate, thus yielding an integrated device.

In another aspect of the invention, the efficiency with which an incoming pump current is converted into the ballast laser signal changes, typically decreasing, before failure and this change in conversion efficiency is used as the basis for an early warning of future failure of the amplifier. In one approach, the pump current is held constant and a decrease in the ballast laser signal then indicates a decrease in the conversion efficiency. In another approach, the pump current is adjusted so that the ballast laser signal is held constant. An increase in the amount of pump current required then indicates a decrease in the conversion efficiency.

The present invention is particularly advantageous because it provides early warning of future failure, thus allowing proactive steps to be taken before the actual failure of the optical amplifier. In addition, the early warning is provided without diverting a portion of the amplified signal. Thus, no tap loss is introduced.

Other aspects of the invention include methods based on the above and systems which include optical amplifiers with early warning failure detection capability. Examples of such systems include fiber optic communications systems, transmitters, receivers, and switching nodes.

BRIEF DESCRIPTION OF THE DRAWING

The invention has other advantages and features which will be more readily apparent from the following detailed description of the invention and the appended claims, when taken in conjunction with the accompanying drawing, in which:

DETAILED DESCRIPTION OF THE PREFERRED EMBODIMENTS

Figure 1:
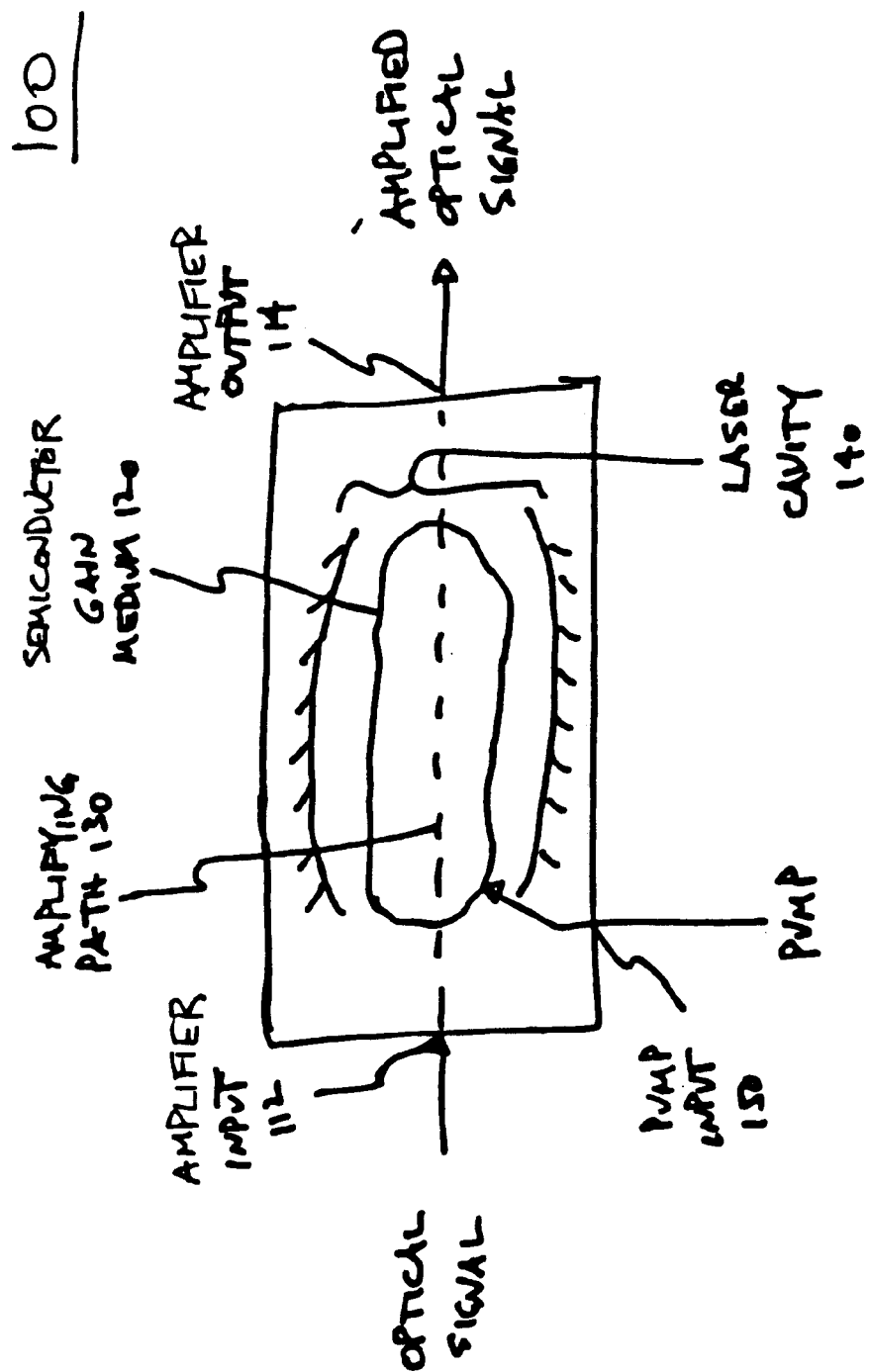
FIG. 1 is a diagram of a vertical lasing semiconductor optical amplifier (VLSOA).

FIG. 1 is a diagram of a lasing semiconductor optical amplifier (lasing SOA) 100 in accordance with the present invention. The lasing SOA 100 has an amplifier input 112 and an amplifier output 114. The lasing SOA 100 further includes a semiconductor gain medium 120, with an amplifying path 130 coupled between the amplifier input 112 and the amplifier output 114 of the lasing SOA 100 and traversing the semiconductor gain medium 120. The lasing SOA 100 further includes a laser cavity 140 including the semiconductor gain medium 120, and a pump input 150 to the semiconductor gain medium 120. Different geometries are possible. In a vertical lasing semiconductor optical amplifier (VLSOA), the laser cavity 140 is oriented vertically with respect to the amplifying path 130. In transverse and longitudinal lasing SOAs, the laser cavity is oriented transversely or longitudinally (i.e., in-line), respectively, with respect to the amplifying path 130. The pump input 150 is for receiving a pump to pump the semiconductor gain medium 120 above a lasing threshold for the laser cavity 140.

Figure 2:
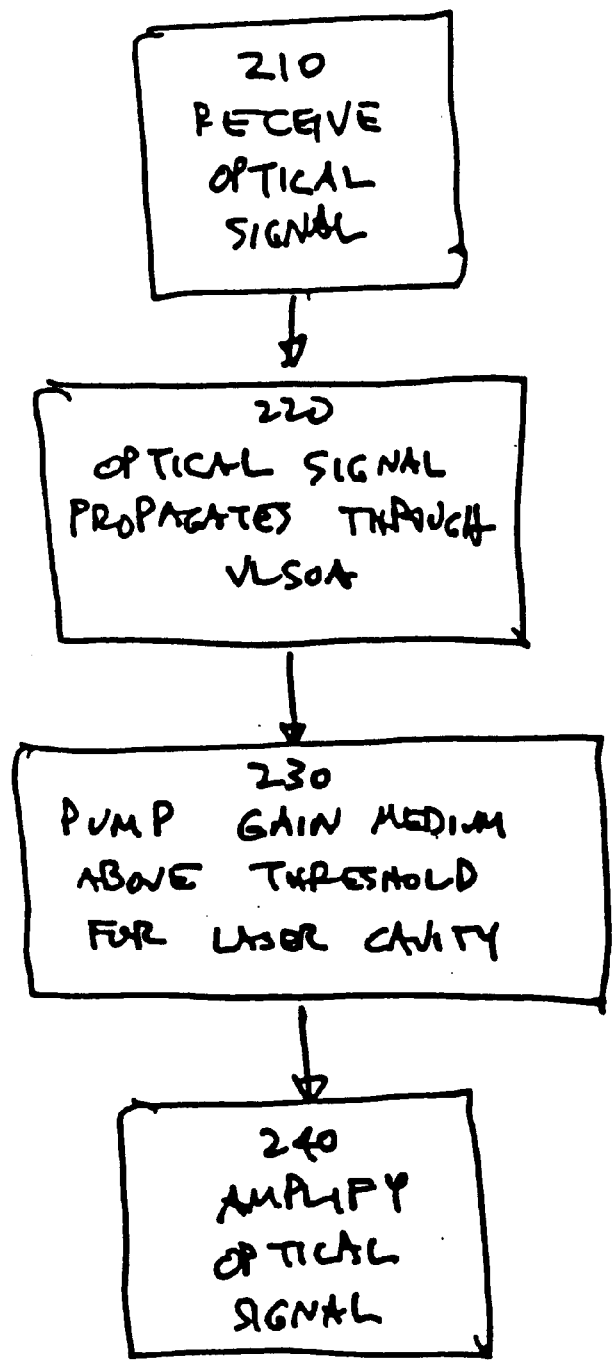
FIG. 2 is a flowchart showing the operation of a VLSOA used as an amplifier.

FIG. 2 is a flow diagram illustrating operation of lasing SOA 100 when it is used as an amplifier. The lasing SOA 100 receives 210 an optical signal at its amplifier input 112. The optical signal propagates 220 along the amplifying path 130. The pump received at pump input 150 pumps 230 the semiconductor gain medium above a lasing threshold for the laser cavity 140, thus generating a laser field. For reasons which will be apparent below, this lasing field shall be referred to as a ballast laser signal. It may or may not be output from the lasing SOA 100 (e.g., it may be absorbed rather than output). When lasing occurs, the round-trip gain offsets the round-trip losses for the laser cavity 140. In other words, the gain of the semiconductor gain medium 120 is clamped to the gain value necessary to offset the round-trip losses. The optical signal is amplified 240 according to this gain value as it propagates along the amplifying path 130 (i.e., through the semiconductor gain medium 120). The amplified signal exits the lasing SOA 100 via the amplifier output 114.

Note that the gain experienced by the optical signal as it propagates through the lasing SOA 100 is determined in part by the gain value of the semiconductor gain medium 120 (it is also determined, for example, by the length of the amplifying path 130) and this gain value, in turn, is determined primarily by the lasing threshold for the laser cavity 140. In particular, the gain experienced by the optical signal as it propagates through the lasing SOA 100 is substantially independent of the amplitude of the optical signal. This is in direct contrast to the situation with non-lasing SOAs and overcomes the distortion and crosstalk disadvantages typical of non-lasing SOAs.

Figure 3A:
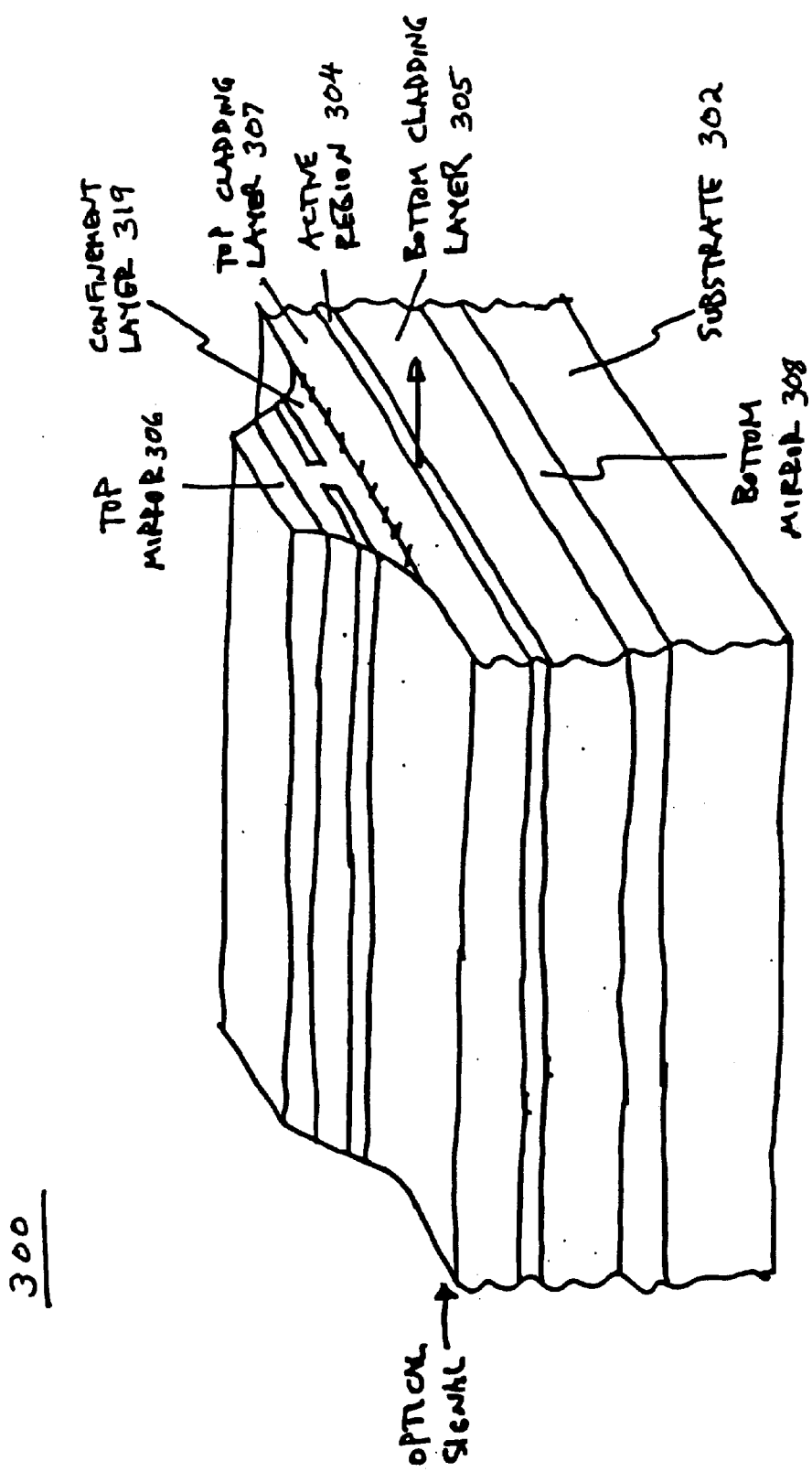
FIG. 3A is a perspective view of one embodiment of a VLSOA.
Figure 3B:
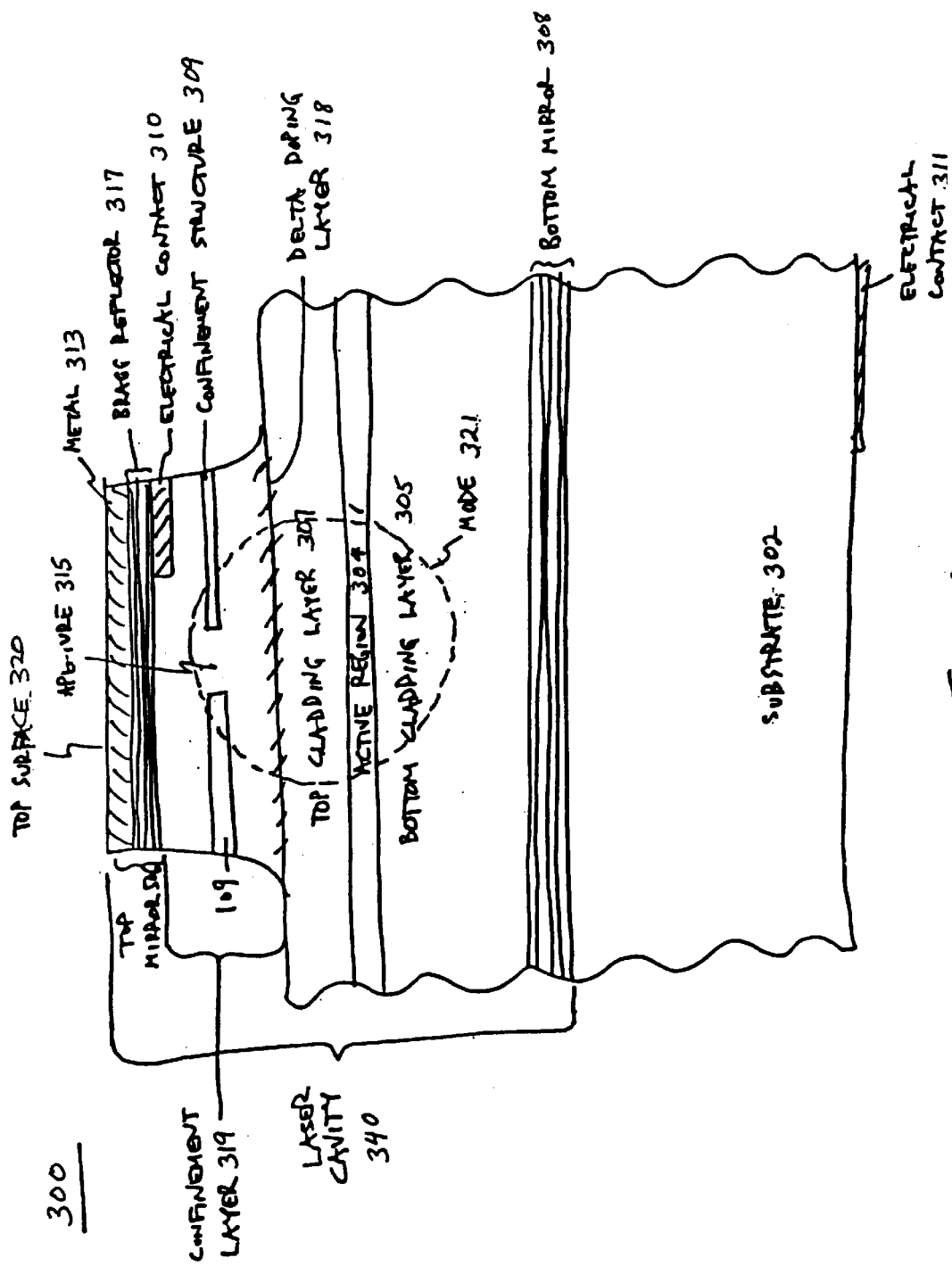
FIG. 3B is a detailed transverse cross-sectional view of one embodiment of a VLSOA.
Figure 3C:
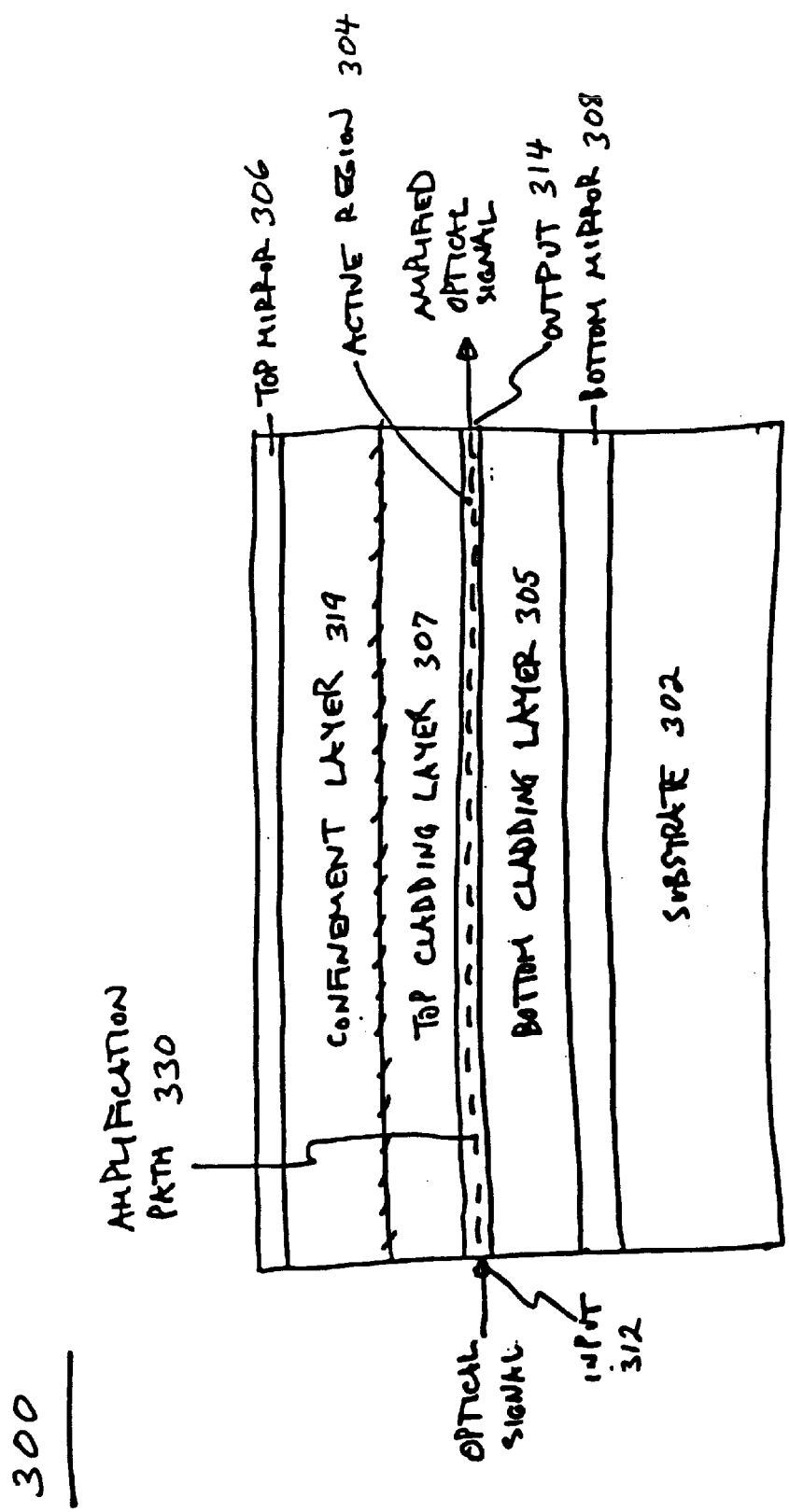
FIG. 3C is a longitudinal cross-sectional view of one embodiment of a VLSOA.

FIGS. 3A–3C are a perspective view, transverse cross-section, and longitudinal cross-section, respectively, of one embodiment of a VLSOA 300 according to the present invention, with FIG. 3B showing the most detail.

Referring to FIG. 3B and working from bottom to top in the vertical direction (i.e., working away from the substrate 302), VLSOA 300 includes a bottom mirror 308, bottom cladding layer 305, active region 304, top cladding layer 307, confinement layer 319, and a top mirror 306. The bottom cladding layer 305, active region 304, top cladding layer 307, and confinement layer 319 are in electrical contact with each other and may be in direct physical contact as well. An optional delta doping layer 318 is located between the top cladding layer 307 and confinement layer 319. The confinement layer 319 includes a confinement structure 309, which forms aperture 315. The VLSOA 300 also includes an electrical contact 310 located above the confinement structure 309, and a second electrical contact 311 formed on the bottom, side of substrate 302.

Comparing to FIG. 1, the semiconductor gain medium 120 includes the active region 304 and the laser cavity 140 is formed primarily by the two mirrors 306 and 308 and the active region 304. This embodiment is electrically pumped so the pump input 150 includes the electrical contacts 310,311.

VLSOA 300 is a vertical lasing semiconductor optical amplifier since the laser cavity 340 is a vertical laser cavity. That is, it is oriented vertically with respect to the amplifying path 330 and substrate 302. The ballast laser signal produced by the laser cavity 340 may be output through either end of the laser cavity (i.e., through top surface 320 and/or through the substrate 302). The VLSOA 300 preferably is long in the longitudinal direction, allowing for a long amplifying path 330 and, therefore, more amplification. The entire VLSOA 300 is an integral structure formed on a single substrate 302 and may be integrated with other optical elements. In most cases, optical elements which are coupled directly to VLSOA 300 will be coupled to the amplifying path 330 within the VLSOA. Depending on the manner of integration, the amplifier input 312 and amplifier output 314 may not exist as a distinct structure or facet but may simply be the boundary between the VLSOA 300 and other optical elements. Furthermore, although this disclosure discusses the VLSOA 300 primarily as a single device, the teachings herein apply equally to arrays of devices.

VLSOA 300 is a layered structure, meaning that it is made up of layers of different materials stacked on substrate 302. This allows the VLSOA 300 to be fabricated using standard semiconductor fabrication techniques, preferably including organo-metallic vapor phase epitaxy (OMVPE) or organo-metallic chemical vapor deposition (OMCVD). Other common fabrication techniques include molecular beam epitaxy (MBE), liquid phase epitaxy (LPE), photolithography, e-beam evaporation, sputter deposition, wet and dry etching, wafer bonding, ion implantation, wet oxidation, and rapid thermal annealing, among others.

The optical signal amplified by the VLSOA 300 is confined in the vertical direction by index differences between bottom cladding 305, active region 304, and top cladding 307, and to a lesser extent by index differences between the substrate 302, bottom mirror 308, confinement layer 319, and top mirror 306. Specifically, active region 304 has the higher index and therefore acts as a waveguide core with respect to cladding layers 305,307. The optical signal is confined in the transverse direction by index differences between the confinement structure 309 and the resulting aperture 315. Specifically, aperture 315 has a higher index of refraction than confinement structure 309. As a result, the mode of the optical signal to be amplified is generally concentrated in dashed region 321. The amplifying path 330 is through the active region 304 in the direction in/out of the plane of the paper with respect to FIG. 3B.

The choice of materials system will depend in part on the wavelength of the optical signal to be amplified, which in turn will depend on the application. Wavelengths in the approximately 1.3–1.6 micron region are currently preferred for telecommunications applications, due to the spectral properties of optical fibers. The approximately 1.28–1.35 micron region is currently also preferred for data communications over single mode fiber, with the approximately 0.8–1.1 micron region being an alternate wavelength region. The term "optical" is meant to include all of these wavelength regions. In a preferred embodiment, the VLSOA 300 is optimized for the 1.55 micron window.

In one embodiment, the active region 304 includes a multiple quantum well (MQW) active region. MQW structures include several quantum wells and quantum wells have the advantage of enabling the formation of lasers with relatively low threshold currents. In alternate embodiments, the active region 304 may instead be based on a single quantum well or a double-heterostructure active region. The active region 304 may be based on various materials systems, including for example InAlGaAs on InP substrates, InAlGaAs on GaAs, InGaAsP on InP, GaInNAs on GaAs, InGaAs on ternary substrates, and GaAsSb on GaAs. Nitride material systems are also suitable. The materials for bottom and top cladding layers 305 and 307 will depend in part on the composition of active region 304.

Examples of top and bottom mirrors 306 and 308 include Bragg reflectors and non-Bragg reflectors such as metallic mirrors. Bottom mirror 308 in FIG. 3 is shown as a Bragg reflector. Top mirror 306 is depicted as a hybrid mirror, consisting of a Bragg reflector 317 followed by a metallic mirror 313. Bragg reflectors may be fabricated using various materials systems, including for example, alternating layers of GaAs and AlAs, $SiO_2$ and $TiO_2$, InAlGaAs and InAlAs, InGaAsP and InP, AlGaAsSb and AlAsSb or GaAs and AlGaAs. Gold is one material suitable for metallic mirrors. The electrical contacts 310, 311 are metals that form an ohmic contact with the semiconductor material. Commonly used metals include titanium, platinum, nickel, germanium, gold, palladium, and aluminum. In this embodiment, the laser cavity is electrically pumped by injecting a pump current via the electrical contacts 310, 311 into the active region 304. In particular, contact 310 is a p-type contact to inject holes into active region 304, and contact 311 is an n-type contact to inject electrons into active region 304. Contact 310 is located above the semiconductor structure (i.e., above confinement layer 319 and the semiconductor part of Bragg reflector 317, if any) and below the dielectric part of Bragg reflector 317, if any. For simplicity, in FIG. 3, contact 310 is shown located between the confinement layer 319 and Bragg reflector 317, which would be the case if Bragg reflector 317 were entirely dielectric. VLSOA 300 may have a number of isolated electrical contacts 310 to allow for independent pumping within the amplifier. This is advantageous because VLSOA 300 is long in the longitudinal direction and independent pumping allows, for example, different voltages to be maintained at different points along the VLSOA. Alternately, the contacts 310 may be doped to have a finite resistance or may be separated by finite resistances, rather than electrically isolated.

Confinement structure 309 is formed by wet oxidizing the confinement layer 319. The confinement structure 309 has a lower index of refraction than aperture 315. Hence, the effective cross-sectional size of laser cavity 340 is determined in part by aperture 315. In other words, the confinement structure 309 provides lateral confinement of the optical mode of laser cavity 340. In this embodiment, the confinement structure 309 also has a lower conductivity than aperture 315. Thus, pump current injected through electrical contact 310 will be channeled through aperture 315, increasing the spatial overlap with optical signal 321. In other words, the confinement structure 309 also provides electrical confinement of the pump current.

As lasing SOAs approach failure, there is a shift in the wavelength of the ballast laser signal. The remainder of this disclosure shall be described in the context of VLSOAs and a shift to a longer wavelength but it is to be understood that the invention is not limited to this scenario. It is equally applicable to other types of lasing SOAs, including both the transverse and longitudinal geometries, and to cases in which the shift is to a shorter wavelength.

In certain cases, the cause of the wavelength shift may be an increase in temperature within the VLSOA. In other words, as the VLSOA begins to fail, its temperature increases, thus causing the wavelength shift. Regardless of the cause, the wavelength shift may be used as an early warning device to identify VLSOAs just prior to their actual failure. The wavelength shift typically accelerates with time as the failure mode of the VLSOA becomes more pronounced. Small wavelength shifts (e.g., of 0.1 nm) may be detected significantly in advance of failures (possibly even months before the actual failure) and much larger wavelength shifts can occur minutes or even seconds before the failure.

Figure 4:
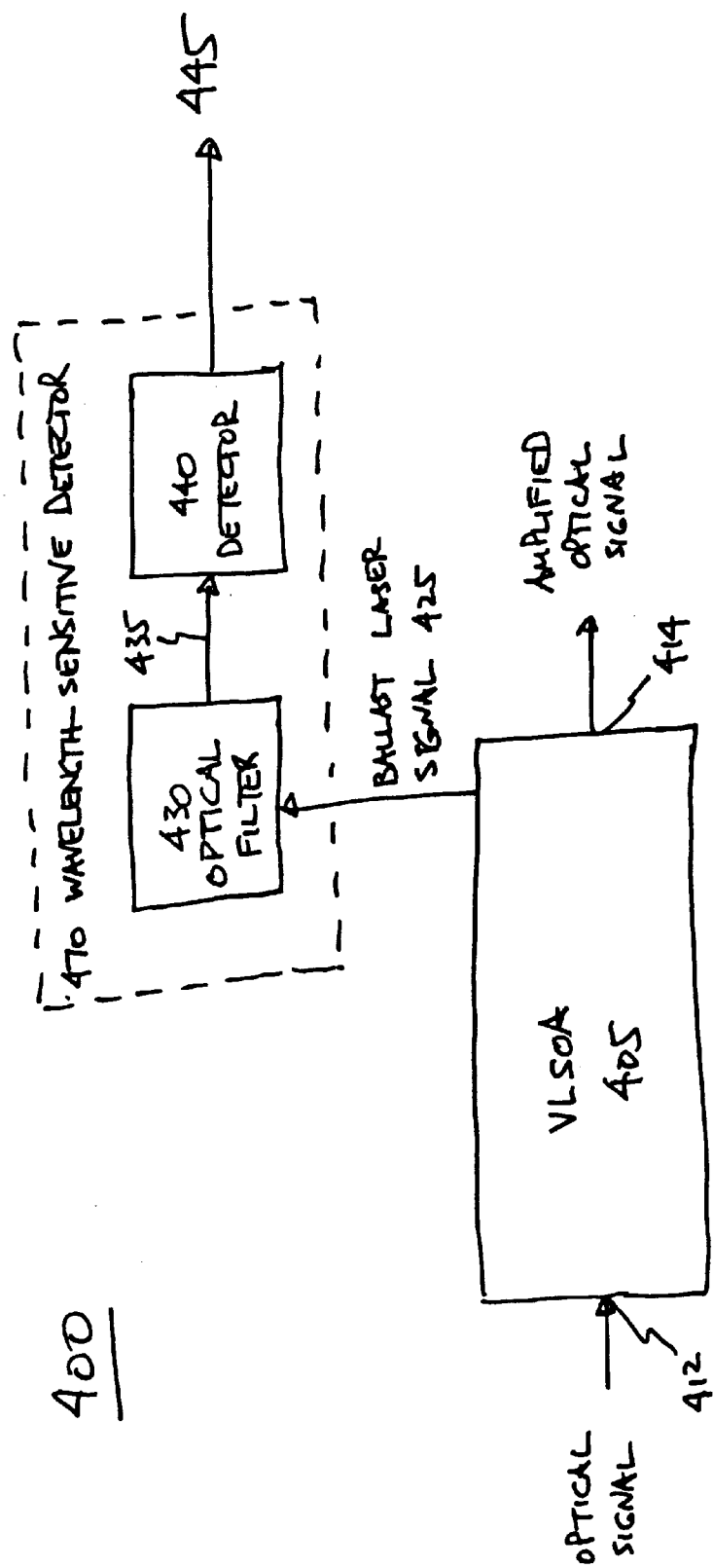
FIG. 4 is a functional block diagram of an optical amplifier with early warning failure detection.

FIG. 4 is a functional block diagram of an optical amplifier 400 with early warning failure detection. The optical amplifier 400 includes a VLSOA 405 and a wavelength-sensitive detector 470. The wavelength-sensitive detector 470 is coupled to receive the ballast laser signal 425 from VLSOA 405. The wavelength-sensitive detector 470 detects the wavelength shift in the ballast laser signal 425, thus permitting early warning of a future failure of the VLSOA 405.

In the implementation shown in FIG. 4, the wavelength-sensitive detector 470 includes an optical filter 430 coupled to a detector 440. The optical filter 430 has a spectral response which varies with wavelength. In particular, the spectral response is selected in order to detect the shift in wavelength. Examples of optical filters include thin-film resonant cavity filters, thin-film multicavity filters, and arrayed waveguide grating type filters. The optical filter 430 may be integrated with VLSOA 405, directly coupled to VLSOA 405 or implemented as components which are discrete from VLSOA 405. Examples of detectors 440 include PIN diodes and avalanche photodetectors. Examples of wavelength-sensitive detectors 470 which do not consist of an optical filter 430 combined with a detector 440 are detectors whose inherent spectral sensitivity is suitable for detecting the wavelength shift.

In alternate embodiments, early warning of a future failure is based on observing the ballast laser signal 425, but not on detecting a wavelength shift. For example, the ballast laser signal 425 can be monitored for a change in the efficiency of converting the incoming pump current to the ballast laser signal 425. Assume for the moment that the amplitude of the incoming optical signal is constant or that there is no incoming optical signal so that variations in the amplitude of the ballast laser signal are not caused by variations in the incoming optical signal. In one implementation, efficiency is monitored by using a constant pump current. A decrease in the ballast laser signal 425 then indicates a decrease in the conversion efficiency from pump current to ballast laser signal 425. This, in turn, is often an early indication of future failure. Alternately, the pump current can be adjusted so that the ballast laser signal 425 has a constant strength. An increase in the amount of pump current required means there has been a decrease in the conversion efficiency, again signaling possible future failure of the device.

The optical amplifier 400 of FIG. 4 can be straightforwardly adapted to implement this type of early warning. For example, the optical filter 430 may be removed. If a constant pump current is applied, then the detector output 445 serves as an early warning signal. If a constant ballast laser signal 425 is maintained, then the pump current (or an indication of the amount of pump current required to maintain the constant strength ballast laser signal 425) serves as the early warning signal. As with the wavelength-sensitive approach, the detector 440 can be integrated on chip with the VLSOA, placed inside a common package with the VLSOA, and/or coupled to the VLSOA via free space optics, beam splitters, mirrors, filters, guided wave optics, fibers, etc. As with the wavelength-sensitive approach, although the above example uses a VLSOA, this approach also applies to lasing SOAs which utilize other geometries (including transverse and longitudinal geometries).

Figure 5:
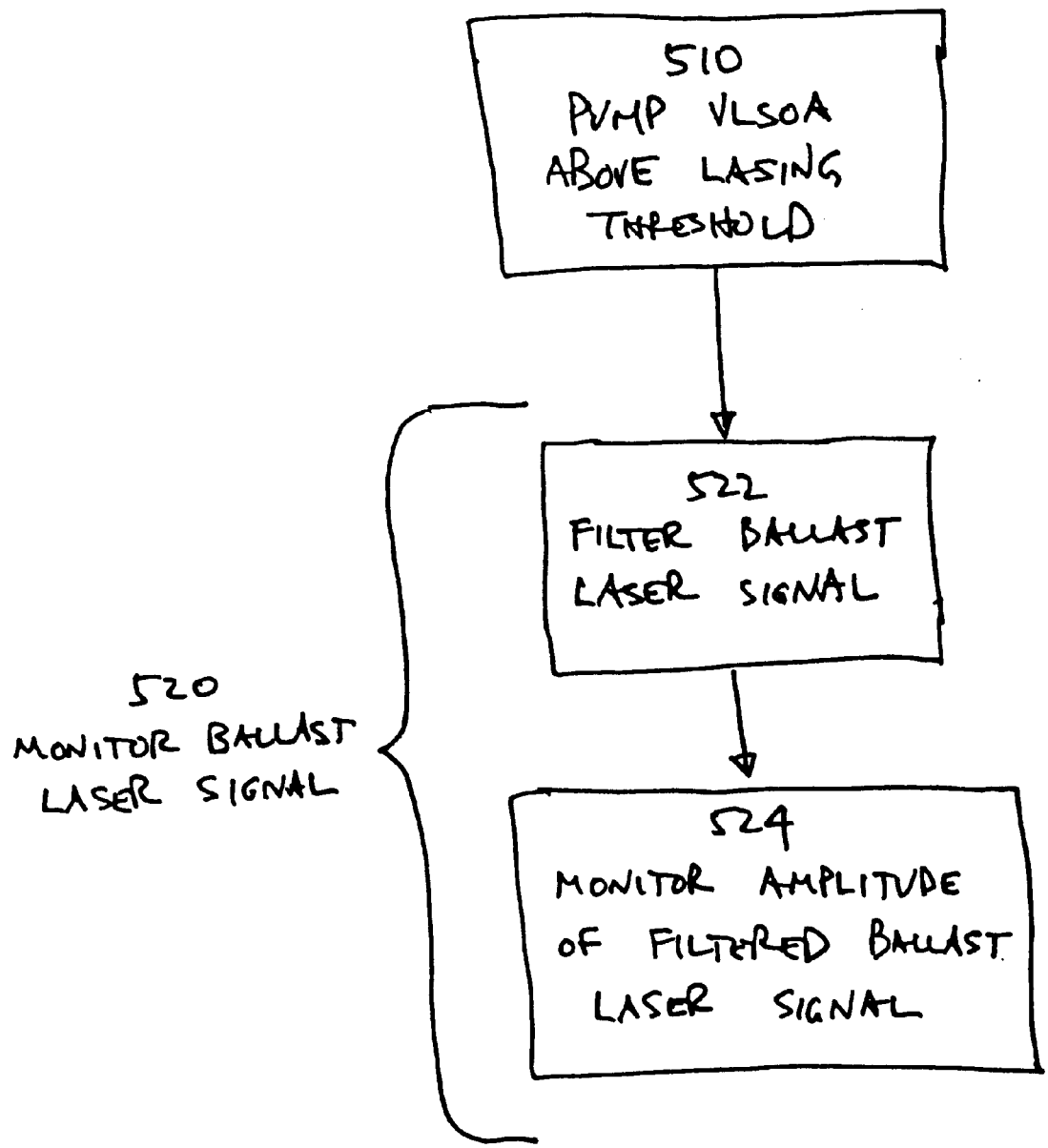
FIG. 5 is a flow diagram illustrating operation of an optical amplifier with early warning failure detection.

Returning now to the wavelength-sensitive case, FIG. 5 is a flow diagram illustrating operation of amplifier 400. The VLSOA 405 is pumped 510 above a lasing threshold for the VLSOA. As a result, the VLSOA 405 generates a ballast laser signal 425. VLSOA 405 also has an amplifier input 412 and an amplifier output 414. An optical signal enters the VLSOA 405 via amplifier input 412, where it is amplified and transmitted via amplifier output 414. The ballast laser signal 425 acts as a ballast with respect to the amplification process, thus gain-clamping the VLSOA. When the VLSOA 405 is functioning properly, the wavelength of the ballast laser signal 425 falls within some normal operating range. When the VLSOA 405 is approaching failure, the wavelength of the ballast laser signal 425 experiences a pre-failure shift. The wavelength-sensitive detector 470 monitors 520 the ballast laser signal for the pre-failure shift.

FIGS. 6A–6D are spectral diagrams illustrating early warning failure detection based on optical filtering. These examples use the filter 430—detector 440 implementation shown in FIG. 4. In other words, as a special case of step 520, the optical filter 430 filters 522 the ballast laser signal 425. The detector 440 monitors 524 the amplitude of the filtered signal 435.

For convenience, the symbol $\lambda$ is used to denote a normal operating wavelength and $\lambda+\delta$ to denote a shifted wavelength. The use of the variable $\delta$ is not meant to imply that the shift in wavelength occurs as a discrete jump. In other words, it is not meant to imply that the wavelength jumps from $\lambda$ to $\lambda+\delta$ prior to failure. Typically, but not always, the wavelength varies continuously instead, at some point reaching and then passing $\lambda+\delta$. Thus, the quantity $\delta$ can be thought of as a threshold for early warning failure detection. Positive $\delta$ indicates a shift to longer wavelengths and negative $\delta$ indicates a shift to shorter wavelengths. In one embodiment, the operating wavelength $\lambda$ falls in the range of approximately 1.3–1.6 micron (i.e., the wavelength range currently used for telecommunications) and the threshold $\delta$ is in the range of 1–15 nm.

In FIGS. 6A–6D, the spectrum of the ballast laser signal during normal operation lies in the vicinity of $\lambda$ and is shown by curve 610. The spectrum after the wavelength shift to $\lambda+\delta$ is shown by curve 620. The spectral response of the optical filter 430 is shown by curves 630A–D, respectively.

Figure 6A:
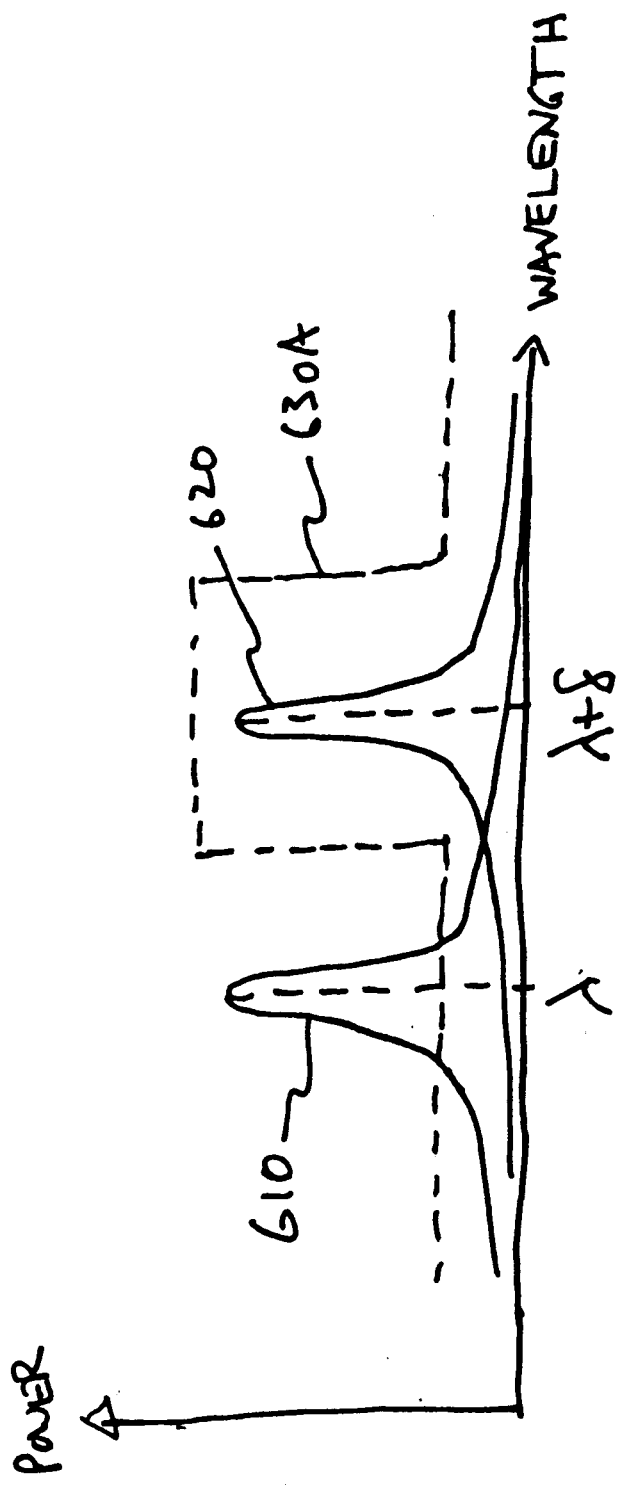
FIGS. 6A–6D are spectral diagrams illustrating early warning failure detection based on optical filtering.
Figure 6B:
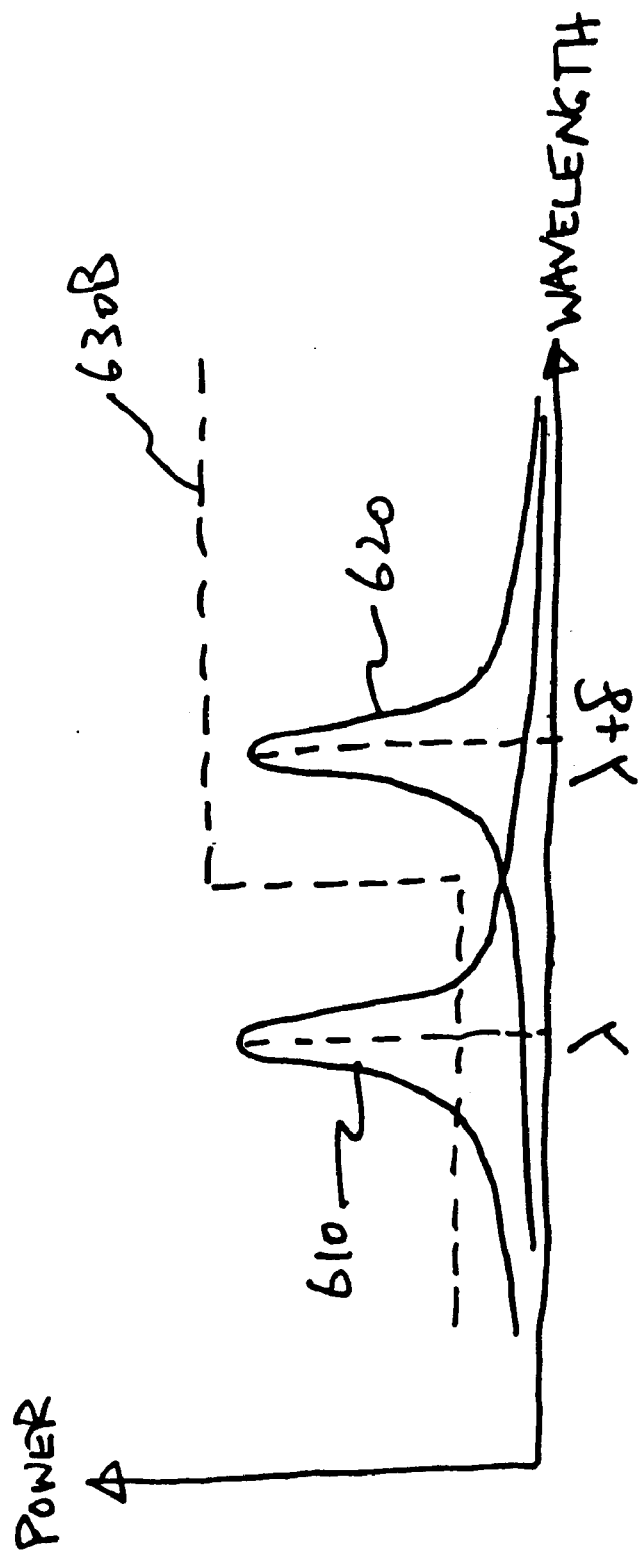

In FIGS. 6A and 6B, the post-shift wavelength $\lambda+\delta$ lies in the pass band of the optical filter 430; whereas the operating wavelength $\lambda$ lies in the stop band. In FIG. 6A, the optical filter 430 is a bandpass filter with one edge located between wavelengths $\lambda$ and $\lambda+\delta$ and the other edge located at a wavelength longer than $\lambda+\delta$. In FIG. 6B, the optical filter 430 is a lowpass filter with edge located between wavelengths $\lambda$ and $\lambda+\delta$.

Both of these examples function similarly. A properly functioning VLSOA 405 generates a ballast laser signal 425 with spectrum 610. Since the spectrum 610 falls primarily in the stop band of the optical filter 430, it is significantly attenuated. A weak optical signal 435 is received by detector 440, which then outputs a correspondingly weak electrical signal 445. Comparatively, when the VLSOA 405 begins to fail, the spectrum of ballast laser signal 425 shifts. Curve 620 shows the spectrum after it has shifted by an amount $\delta$. As a result of this wavelength shift, more of the spectrum falls in the pass band of the optical filter 430. Detector 440 converts the stronger optical signal 435 into a stronger electrical signal 445. Thus, as the VLSOA 405 approaches failure, the electrical signal 445 produced by detector 440 increases.

Figure 6C:
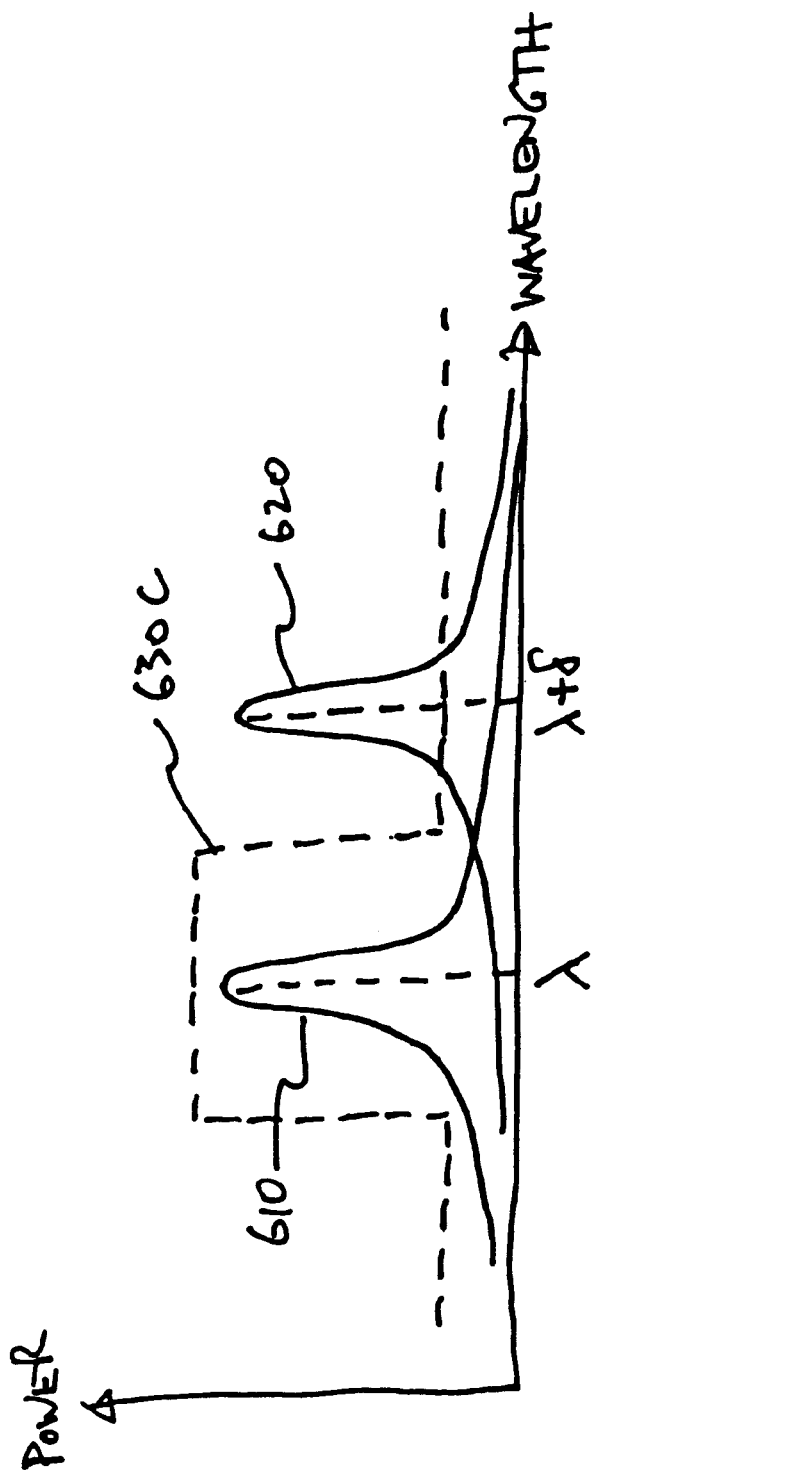
Figure 6D:
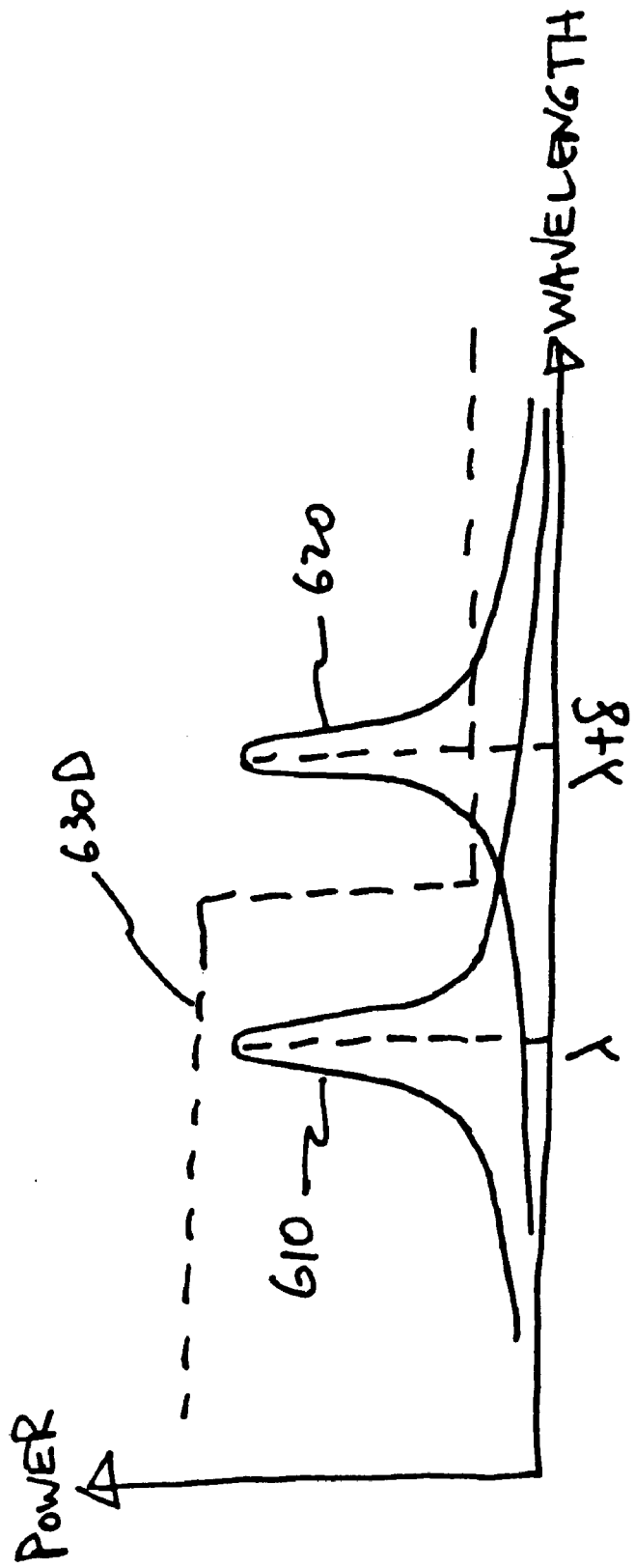

In FIGS. 6C–6D, the opposite approach is taken. The post-shift wavelength $\lambda+\delta$ lies in the stop band of the optical filter; whereas the operating wavelength $\lambda$ lies in the pass band. In FIG. 6C, the optical filter 430 is a bandpass filter with one edge located between wavelengths $\lambda$ and $\lambda+\delta$ and the other edge located at a wavelength shorter than $\lambda$. In FIG. 6D, the optical filter 430 is a highpass filter with edge located between wavelengths $\lambda$ and $\lambda+\delta$.

In these two examples, a properly functioning VLSOA 405 generates a ballast laser signal 425 with a spectrum 610 which falls primarily in the pass band of the optical filter 430. However, when the VLSOA 405 begins to fail, the spectrum of the ballast laser signal 425 shifts towards the stop band. As a result of this wavelength shift, the optical signal 435 received by detector 440 falls in strength. Thus, as the VLSOA 405 approaches failure, the electrical signal 445 produced by detector 440 decreases.

Figure 7A:
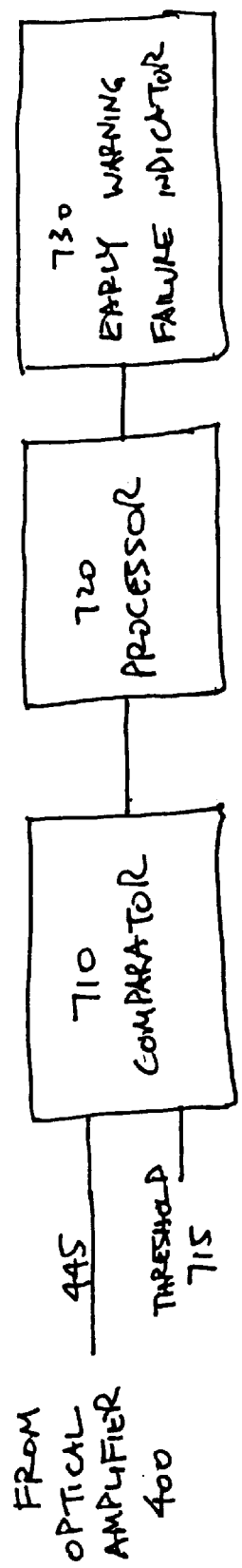
FIGS. 7A–7C are block diagrams of various embodiments of processing circuitry for early warning failure detection.
Figure 7B:
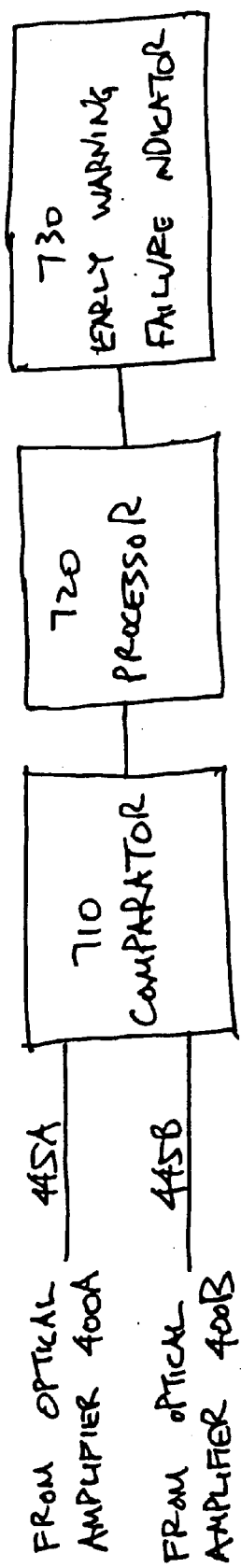
Figure 7C:
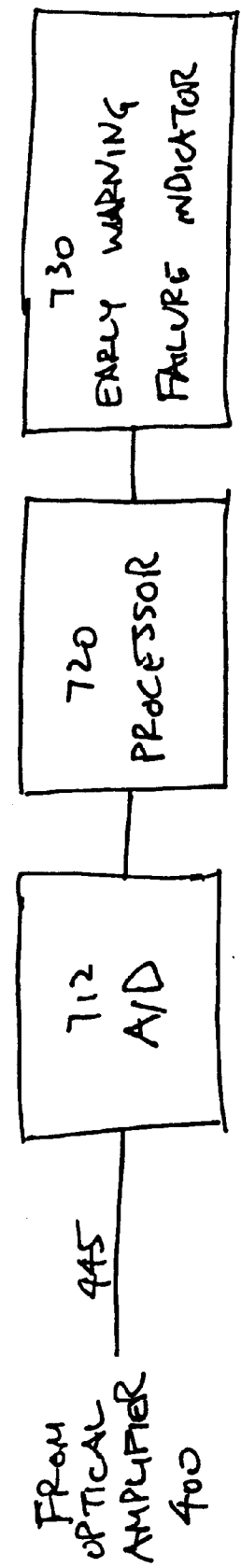

FIGS. 7A–7C are block diagrams of various types of processing circuitry suitable for analyzing the early warning electrical signals 445 generated by optical amplifier 400. The processing circuitry basically monitors the signal for an increase/decrease which would indicate a future failure of VLSOA 405. The following examples are discussed assuming that an increase in the electrical signal 445 indicates an early warning for VLSOA failure, but the same principles apply to the case of a decrease also.

In FIG. 7A, the optical amplifier 400 is coupled to the following elements in series: a comparator 710, processor 720 and early warning failure indicator 730. Examples of comparator 710 include analog circuitry, digital circuitry (assuming an A/O conversion), and comparison functionality implemented in software. Examples of processor 720 include general purpose processors, DSP processors, micro controllers, and logic circuitry (e.g., as a stand-alone chip or integrated as a part of a larger chip). Examples of early warning failure indicator 730 include light emitting diodes, display icons on computer screens, and the activation of messages or software routines. In FIG. 7A, the comparator 710 compares the incoming early warning signal 445 to a reference threshold 715. The threshold may be either static or dynamic (e.g., adaptive). When the threshold is exceeded, the comparator 710 signals detection of a shift in wavelength, for example by toggling its output. The processor 720 then activates the early warning failure indicator 730.

In FIG. 7B, there are two optical amplifiers 400A and 400B coupled to comparator 710. The early warning signals 445A and 445B from the optical amplifiers 400 are compared by comparator 710. If the two signals 445 are approximately equal, then it is assumed that both VLSOAs 405 are functioning properly. However, if the two signals 445 differ by too much, then comparator 710 signals the processor 720, which activates the early warning failure indicator 730.

In FIG. 7C, the processor 720 implements the comparison function. The early warning signal 445 is converted from analog to digital form by A/D converter 712 and then received by processor 720, which implements the logic necessary to determine whether to activate the early warning failure indicator 730.

Figure 8:
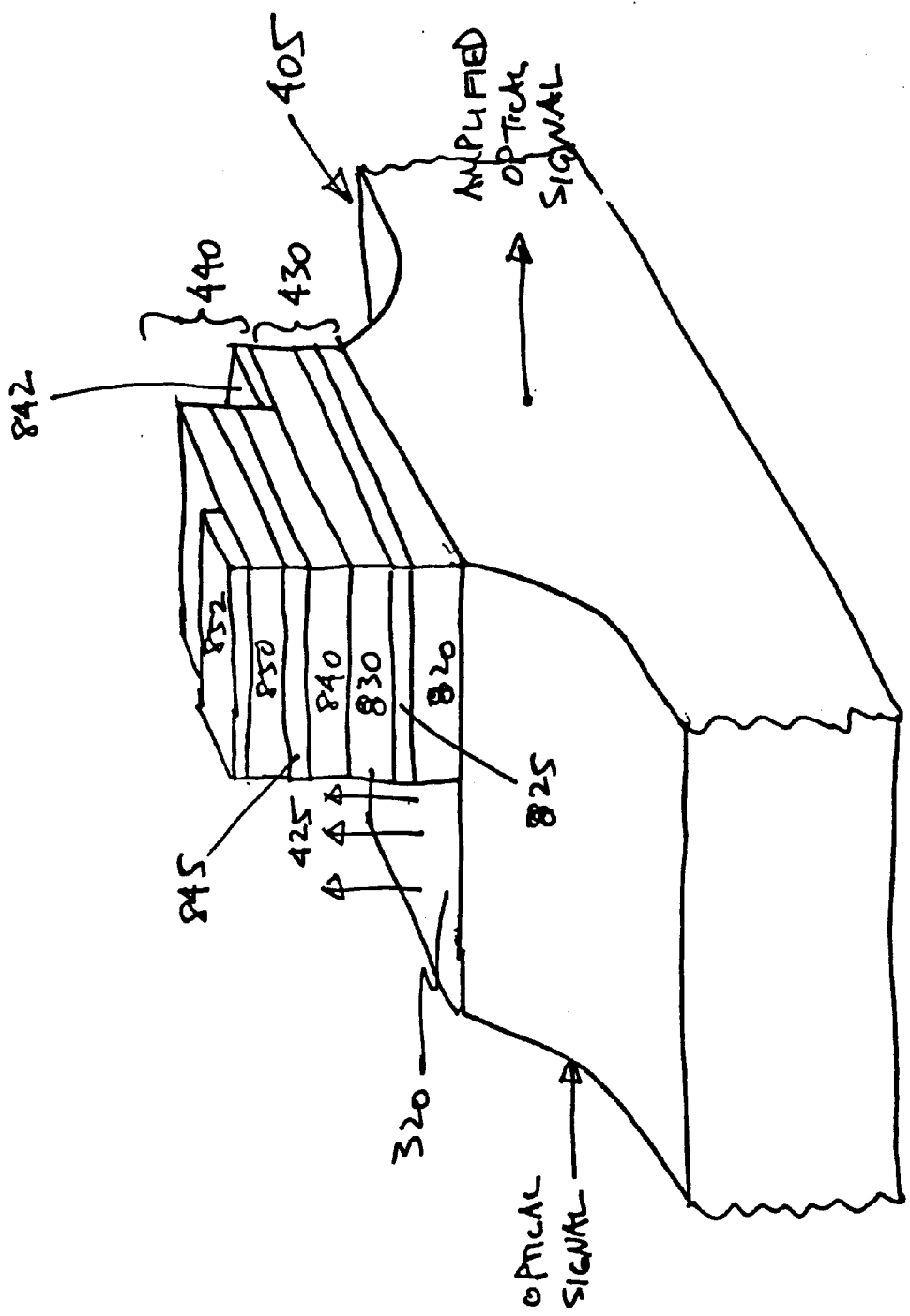
FIG. 8 is a perspective view of one implementation of an optical amplifier with early warning failure detection.

FIG. 8 is a perspective view of one implementation of an optical amplifier. In this embodiment, a VLSOA 405, optical filter 430 and detector 440 are integrated on a common substrate. The VLSOA 405 has the structure shown in FIG. 3, although not as much detail is shown in FIG. 8 for purposes of clarity. The VLSOA 405 outputs the ballast laser signal 425 through its top surface 320. Some or all of this ballast laser signal 425 enters the optical filter 430.

The optical filter 430 is implemented as a Fabry-Perot filter integrated directly above the top surface 320 of the VLSOA 405. The Fabry-Perot filter 430 includes two mirrors 820 and 830 separated by an optical cavity 825. In this example, the mirrors 820 and 830 are InP/InGaAsP Bragg mirrors. The cavity 825 is formed from typical materials such as InP, InGaAsP or InGaAs, and it typically has an optical path length which is an integer number of half wavelengths. Examples of other materials suitable for use in cavity 825, mirror 820 and mirror 830 include other semiconductor materials (e.g., InP/InGaAs, GaAs/AlGas, AlInGaAs, AlN, InGaAsN, GaN, Si, and amorphous-Si), dielectric materials (e.g., SiO2, MgO and Al2O3) and polymer materials. The ballast laser signal 425 emitted through the VLSOA top surface 320 enters the first mirror 820 at a right angle to its surface. The light resonates within the cavity 825, causing only the resonant wavelengths to add in phase. The length of the cavity 825 determines the resonant wavelengths. The resonant wavelengths are transmitted through the second mirror 830 to the detector 440.

The detector 440 is integrated directly above the Fabry-Perot filter 430. In the example of FIG. 8, the detector 440 is a PIN detector. From bottom to top, it includes a bottom cladding layer 840 which is either n or p doped, an undoped or intrinsic absorbing layer 845, and a top cladding layer 850 which has the opposite doping as the bottom cladding layer 840. Electrical contacts 842 and 852 are made to the bottom and top cladding layers 840 and 850, respectively. In the example shown in FIG. 8, the top and bottom cladding layers 840–850 are InP and the absorbing layer 845 is InGaAs. The filtered ballast laser signal is absorbed in the lower bandgap intrinsic layer 845 and electron-hole pairs are generated. The built-in field surrounding the p-i-n junction sweeps out the holes to the higher bandgap p-region and the electrons to the higher band gap n-region and thus generates a current between the two electrical contacts 842, 852. The built-in field can be enhanced by reverse biasing the p-i-n junction. The generated current serves as the early warning signal 445. If the filter 430 is electrically conductive, the top electrical contact 310 to the VLSOA 405 (see FIG. 3B) and the bottom electrical contact 842 to the detector 440 may be implemented as a single contact.

Figure 9:
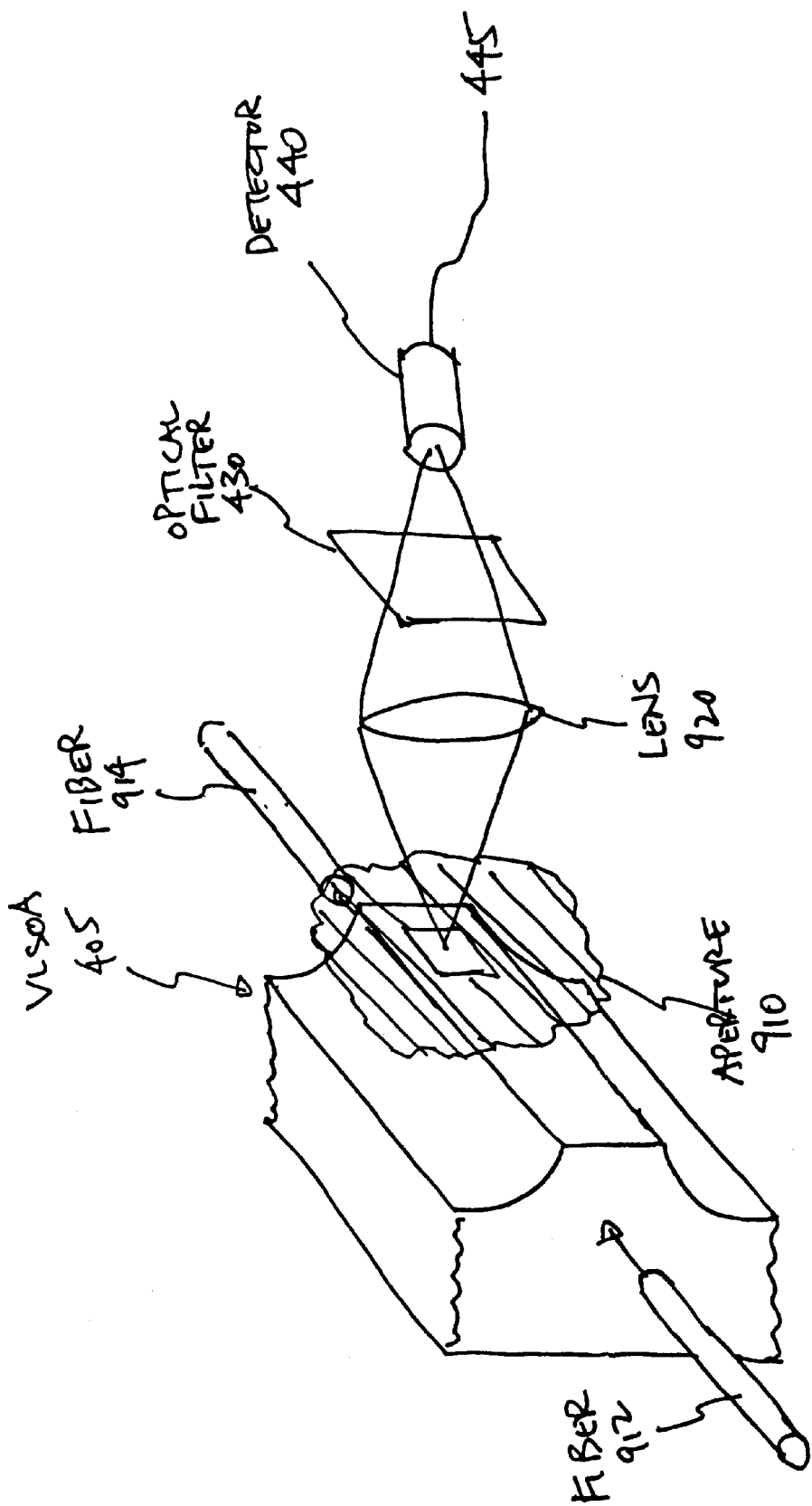
FIG. 9 is a perspective view of another implementation of an optical amplifier with early warning failure detection.

FIG. 9 is a perspective view of another implementation of an optical amplifier, in which the VLSOA 405, optical filter 430 and detector 440 are discrete components. The amplifier input and output of the VLSOA 405 are coupled to fiber pigtails 912 and 914. A lens 920 collects some or all of the ballast laser signal 425 generated by VLSOA 405 and deposits it onto the detector 440. An aperture 910 placed over the top surface 320 of VLSOA 405 defines the extent of the ballast laser signal 425 which is collected by the lens 920. The optical filter 430 is located in the optical path between the VLSOA 405 and the detector 440. The discrete elements are held in position using conventional opto-mechanical packaging techniques.

Figure 10:
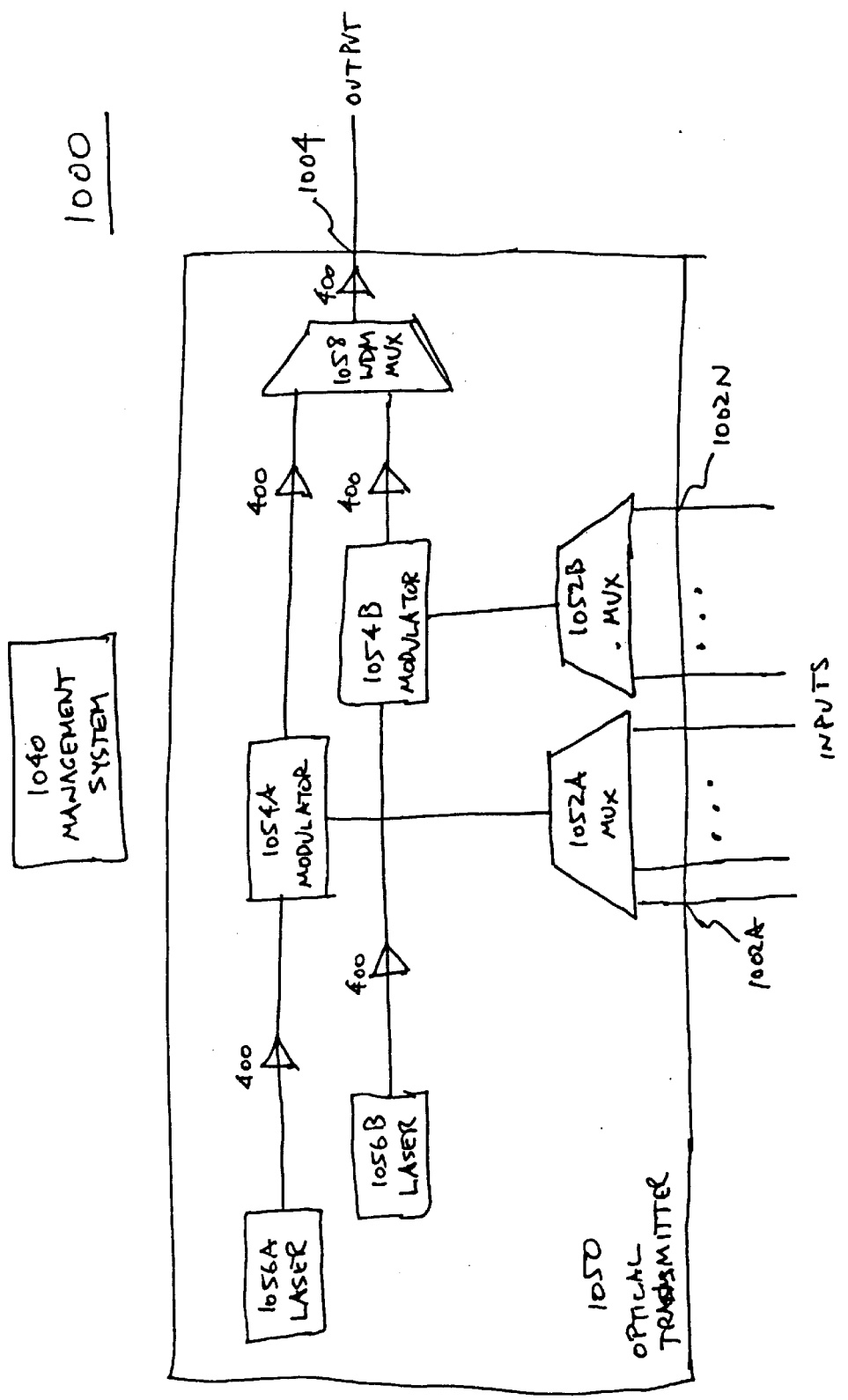
FIGS. 10–12 are diagrams of various fiber optic communications systems using optical amplifiers with early warning failure detection.
Figure 11:
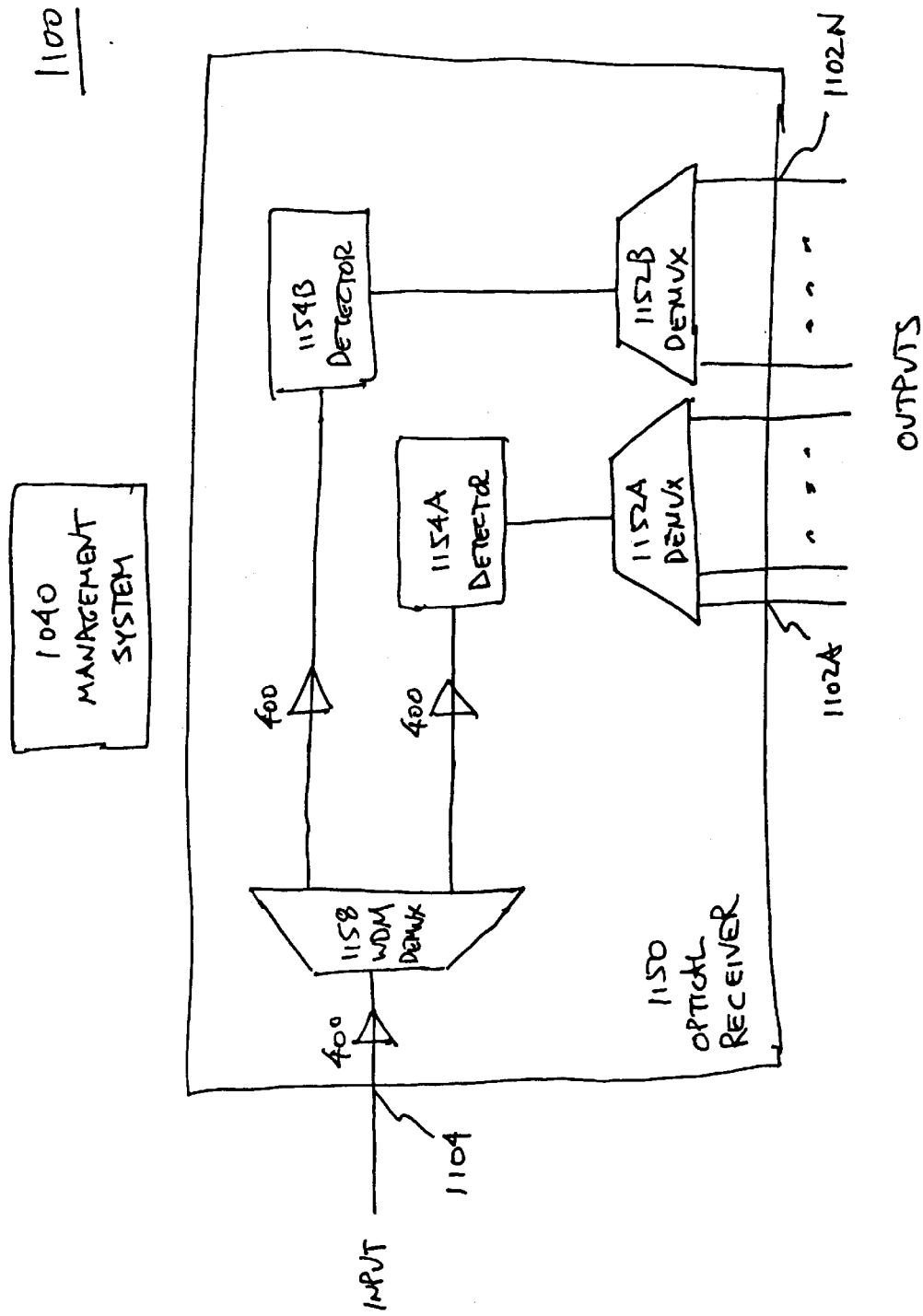
Figure 12:
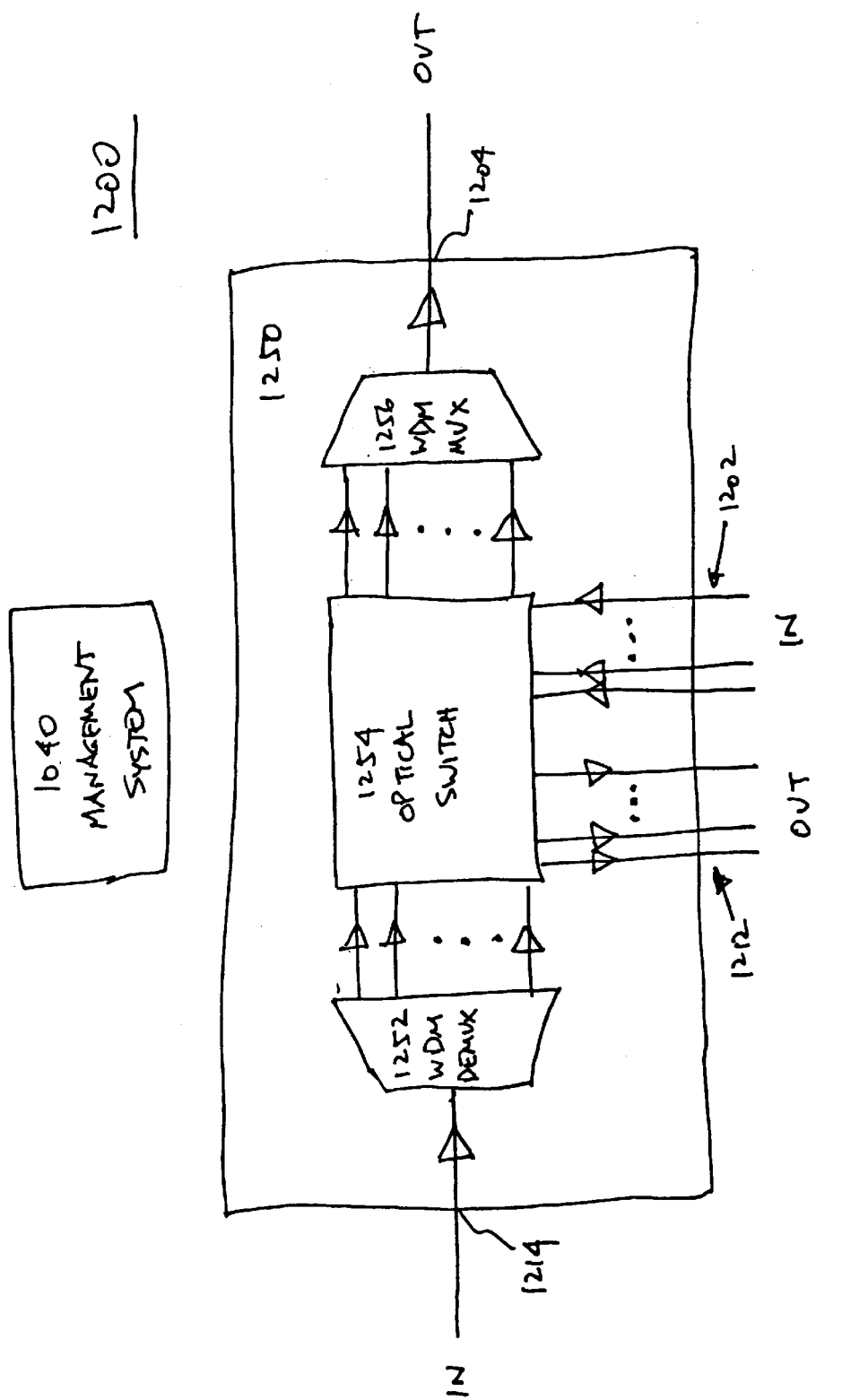

FIGS. 10–12 are diagrams of example fiber optic communications systems which use optical amplifiers with early warning failure detection. FIG. 10 depicts a transmitter system, FIG. 11 depicts a receiver system, and FIG. 12 depicts a node for a fiber optic network. These are examples of various components in a fiber optic communications system. One task in overall network management is the detection and correction of device failures within the network. These failures may result in a large amount of data being lost. As a result, a network manager must respond quickly to minimize the amount of lost data. In the event of a failure, the network manager typically identifies the source of the failure, routes data traffic around the failure, and repairs the failure. Early warning before the occurrence of a failure allows the network manager to take proactive steps instead. For example, he may re-route traffic and then replace the optical amplifier when it is not handling live data. This avoids loss of data and also gives the network manager more time and flexibility as to when to replace the optical amplifier.

Beginning with FIG. 10, transmitter system 1000 includes input ports 1002A–N, an output port 1004, and an optical transmitter 1050 coupling the input ports 1002 to the output port 1004. In this particular example, the optical transmitter 1050 further includes two electrical multiplexers 1052A and 1052B, two electro-optic modulators 1054A and 1054B, two lasers 1056A and 1056B, and a wavelength division multiplexer 1058. Each electrical multiplexer couples some of the input ports 1002 to the electrical input of one of the electro-optic modulators 1054. The lasers 1056 provide the optical input to the modulator 1054. The outputs of the two modulators 1054 are coupled to the wavelength division multiplexer 1058, which is coupled to the output port 1004.

The optical transmitter system 1000 operates as follows. In general, each input port 1002 receives data, which is combined by the optical transmitter 1050 and output as an optical signal via the output port 1004. In this particular implementation, each electrical multiplexer 1052 combines some of the incoming data signals into an electrical signal which drives the corresponding modulator 1054. Each modulator 1054 impresses the data onto the laser signal produced by the corresponding laser 1056. The two lasers 1056 operate at different wavelengths. The wavelength division multiplexer 1058 combines the two modulated optical signals into a single optical signal, which is transmitted via output port 1004.

Optical transmitter system 1000 also includes optical amplifiers 400, which are located wherever amplification is beneficial. The exact locations will depend on the overall system design. The exact locations will depend on the overall system design. The optical amplifier symbols 400 shown in FIG. 10 show examples of where an optical amplifier may be located, but they do not imply that there must be an optical amplifier at every location shown. In FIG. 10, optical amplifiers 400 are shown between lasers 1056 and modulators 1054, in order to amplify the laser signals generated by the laser 1056. They are located between the modulators 1054 and the wavelength division multiplexer 1058, in order to amplify the single-wavelength modulated optical signals produced by the modulators 1054. An optical amplifier 400 is also located after the wavelength division multiplexer 1058, in order to amplify the multi-wavelength modulated optical signal. The optical amplifiers described previously are suitable for use in the optical transmitter system 1000. The optical amplifiers 400 include early warning failure detection and generate early warning signals 445. These signals 445 are routed to management system 1040, which monitors the status of the optical amplifiers 400 and takes appropriate actions when an early warning signal 445 indicates future failure.

In FIG. 11, receiver system 1100 includes an input port 1104, a number of output ports 1102A–N, and an optical receiver 1150 coupling the input port 1104 to the output ports 1102. In this particular example, the optical receiver 1150 includes a wavelength division demultiplexer 1158, two detectors 1154A and 1154B, and two electrical demultiplexers 1152A and 1152B. The wavelength division demultiplexer 1158 couples the input port 1104 to the detectors 1154. Each electrical demultiplexer 1152 couples one of the detectors 1154 to the output ports 1102.

The optical receiver system 1100 generally implements the reverse functionality of optical transmitter system 1000. The input port 1102 receives an optical signal which contains modulated data at multiple wavelengths (two wavelengths in this example). The wavelength division demultiplexer 1158 separates the wavelengths, feeding one to each detector 1154. The detectors 1154 recover electrical signals from the incoming modulated optical signals. These electrical signals are further split by electrical demultiplexers 1152 and then output at ports 1102.

Optical receiver system 1100 also includes optical amplifiers 400, which are located wherever amplification is necessary. In FIG. 11, an optical amplifier 400 is shown before wavelength division demultiplexer 1158, in order to amplify the incoming multi-wavelength modulated optical signal. Optical amplifiers 400 are also shown between wavelength division demultiplexer 1158 and detectors 1154, in order to amplify the single-wavelength modulated optical signals produced by the wavelength division demultiplexer 1158. As with FIG. 10, the optical amplifiers 400 in FIG. 11 include early warning failure detection and generate early warning signals 445. These signals 445 are routed to management system 1140, which monitors the status of the optical amplifiers 400 and takes appropriate actions when an early warning signal 445 indicates future failure.

FIG. 12 depicts a node 1200 for a fiber optic network. The node includes a high-speed input port 1214, a high-speed output port 1204, low-speed input ports 1202 and low-speed output ports 1212. The ports are coupled to each other by an add-drop multiplexer 1250. In this example, the add-drop multiplexer 1250 includes a wavelength division demultiplexer 1252, an optical switch 1254 and a wavelength division multiplexer 1256. The wavelength division demultiplexer 1252 is coupled between the high-speed input port 1214 and the optical switch 1254. The wavelength division multiplexer 1256 is coupled between the optical switch 1254 and the high-speed output port 1204. The low speed ports 1202, 1212 are also coupled to the optical switch 1254.

The high-speed ports 1204, 1214 handle optical signals which contain multiple channels of data. In this example, each channel is located at a different wavelength. The low-speed ports 1202, 1212 handle single channels of data. The wavelength division demultiplexer 1252 splits the incoming multi-channel signal into its constituent channels, which then enter the optical switch 1254. The wavelength division multiplexer 1256 combines channels from the optical switch 1254 into a single, multi-channel optical signal. The optical switch 1254 routes the various channels between the various ports.

As with systems 1000 and 1100, node 1200 also include optical amplifiers 400, which may be located in many different places. The optical amplifiers 400 include early warning failure detection and generate early warning signals 445. These signals 445 are routed to management system 1240, which monitors the status of the optical amplifiers 400 and takes appropriate actions when an early warning signal 445 indicates future failure.

FIGS. 10–12 depict specific implementations of a transmitter, receiver and switching node, but these are intended only as examples. In addition, early warning failure detection can also be used in other types of transmitters, receivers and switching nodes; in other components of fiber communication systems; as well as in other applications which utilize optical amplifiers. For example, optical amplifiers are often used to amplify signals traveling long distances through fibers. The early warning failure detection described above can be used in these systems also.

As another example, the early warning failure detection described above can also be used during the manufacture of optical devices, including testing of devices. For example, early warning failure detection can be used to implement wafer scale testing of devices which include VLSOAs. That is, these devices can be tested while still in wafer form, without having to first dice or cleave the wafer or singulate the devices. The failure detection mechanism can be used to identify already failed or about to fail devices on the wafer, which can then be discarded during subsequent processing.

Although the invention has been described in considerable detail with reference to certain preferred embodiments thereof, other embodiments will be apparent. Therefore, the scope of the appended claims should not be limited to the description of the preferred embodiments contained herein.

What is claimed is:

1. An optical amplifier with early warning failure detection comprising:
   a lasing semiconductor optical amplifier comprising:
     a semiconductor gain medium,
     an amplifying path traversing the semiconductor gain medium,
     a laser cavity including the semiconductor gain medium, and
     a pump input to the semiconductor gain medium for pumping the semiconductor gain medium above a lasing threshold for the laser cavity, whereby the laser cavity generates a ballast laser signal; and
   a wavelength-sensitive detector coupled to receive the ballast laser signal for detecting a shift in wavelength of the ballast laser signal.

2. The optical amplifier of claim 1 wherein the lasing semiconductor optical amplifier comprises a vertical lasing semiconductor optical amplifier (VLSOA) and the laser cavity is oriented vertically with respect to the amplifying path.

3. The optical amplifier of claim 2 wherein:
   the VLSOA comprises layers of different materials stacked on a substrate; and
   the laser cavity comprises a top mirror and a bottom mirror opposing the top mirror, each mirror including at least one of the stacked layers.

4. The optical amplifier of claim 2 wherein the wavelength-sensitive detector comprises:
   an optical filter comprising additional layers of materials stacked on the VLSOA, wherein the optical filter has a spectral response which varies over the shift in wavelength; and
   a detector coupled to the optical filter.

5. The optical amplifier of claim 4 wherein the optical filter comprises a Fabry Perot optical filter.

6. The optical amplifier of claim 4 wherein the detector comprises even further layers of materials stacked on the optical filter.

7. The optical amplifier of claim 2 wherein the substrate is an InP substrate.

8. The optical amplifier of claim 1 wherein the shift in wavelength is a shift to a longer wavelength.

9. The optical amplifier of claim 8 wherein the shift in wavelength is a shift of at least 0.1 nm.

10. The optical amplifier of claim 1 wherein the wavelength-sensitive detector comprises:
    an optical filter coupled to receive the ballast laser signal and having a spectral response which varies over the shift in wavelength; and
    a detector coupled to the optical filter.

11. The optical amplifier of claim 8 wherein:
    the optical filter has a pass band and a stop band, and
    an edge between the pass band and the stop band is located between an operating wavelength of the ballast laser signal and a wavelength of the ballast laser signal after the shift in wavelength.

12. The optical amplifier of claim 1 wherein the lasing semiconductor optical amplifier comprises a transverse lasing semiconductor optical amplifier and the laser cavity is oriented transverse to the amplifying path.

13. The optical amplifier of claim 1 wherein the lasing semiconductor optical amplifier comprises a longitudinally lasing semiconductor optical amplifier and the laser cavity is aligned with the amplifying path.

14. A method for detecting early warning of failure of an optical amplifier, the method comprising:
    pumping a lasing semiconductor optical amplifier (lasing SOA) above a lasing threshold for the lasing SOA, whereby the lasing SOA generates a ballast laser signal; and
    monitoring the ballast laser signal for a shift in wavelength.

15. The method of claim 14 wherein the shift in wavelength is a shift to a longer wavelength.

16. The method of claim 15 wherein the shift in wavelength is a shift of at least 0.1 nm.

17. The method of claim 14 wherein the lasing SOA comprises a VLSOA based on InP.

18. The method of claim 14 wherein the step of monitoring the ballast laser signal for a shift in wavelength comprises:
    optically filtering the ballast laser signal with a spectral response which varies over the shift in wavelength; and
    monitoring an amplitude of the optically filtered ballast laser signal.

19. The method of claim 18 wherein the step of monitoring an amplitude of the optically filtered ballast laser signal comprises:
    monitoring whether the amplitude of the optically filtered ballast laser signal is above a threshold level.

20. The method of claim 18 wherein the step of monitoring an amplitude of the optically filtered ballast laser signal comprises:
    monitoring whether the amplitude of the optically filtered ballast laser signal is below a threshold level.

21. The method of claim 14 further comprising:
    upon detection of the shift in wavelength, signaling the detection of the shift in wavelength.

22. A fiber optic transmitter system comprising:
    an input port for receiving data;
    an optical transmitter coupled to the input port, for generating a modulated optical signal containing the data, the optical transmitter comprising:
      at least one lasing semiconductor optical amplifier (lasing SOA) which generates a ballast laser signal, and
      at least one wavelength-sensitive detector coupled to receive the ballast laser signal from the lasing SOA;
    an output port coupled to the optical transmitter for transmitting the modulated optical signal; and
    a management system coupled to the wavelength-sensitive detector(s) for determining whether a wavelength-sensitive detector has detected a shift in wavelength of the ballast laser signal received by the wavelength-sensitive detector.

23. The fiber optic transmitter system of claim 22 wherein the shift in wavelength is a shift to a longer wavelength.

24. The fiber optic transmitter system of claim 22 wherein the wavelength-sensitive detector comprises:
    an optical filter coupled to receive the ballast laser signal, wherein the optical filter has a pass band and a stop band and an edge between the pass band and the stop band is located between an operating wavelength of the ballast laser signal and a wavelength of the ballast laser signal after the shift in wavelength; and
    a detector coupled to the optical filter.

25. The fiber optic transmitter system of claim 22 wherein the lasing SOA comprises a vertical lasing SOA.

26. A fiber optic receiver system comprising:
- an input port for receiving a modulated optical signal containing data;
- an optical receiver coupled to the input port, for recovering the data from the modulated optical signal, the optical receiver comprising:
  - at least one lasing semiconductor optical amplifier (lasing SOA) which generates a ballast laser signal, and
  - at least one wavelength-sensitive detector coupled to receive the ballast laser signal from the lasing SOA;
- an output port coupled to the optical receiver for transmitting the recovered data; and
- a management system coupled to the wavelength-sensitive detector(s) for determining whether a wavelength-sensitive detector has detected a shift in wavelength of the ballast laser signal received by the wavelength-sensitive detector.

27. The fiber optic receiver system of claim 26 wherein the shift in wavelength is a shift to a longer wavelength.

28. The fiber optic receiver system of claim 26 wherein the wavelength-sensitive detector comprises:
- an optical filter coupled to receive the ballast laser signal, wherein the optical filter has a pass band and a stop band and an edge between the pass band and the stop band is located between an operating wavelength of the ballast laser signal and a wavelength of the ballast laser signal after the shift in wavelength; and
- a detector coupled to the optical filter.

29. The fiber optic receiver system of claim 26 wherein the lasing SOA comprises a vertical lasing SOA.

30. A node for a fiber optic network comprising:
- a high-speed input port for receiving a high speed optical signal containing channels;
- a high-speed output port for transmitting a high speed optical signal containing channels;
- a low-speed input port for receiving multiple channels;
- a low-speed output port for transmitting multiple channels;
- an add-drop multiplexer coupled to the input ports and the output ports for switching the channels between the input ports and the output ports, the add-drop multiplexer comprising:
  - at least one lasing semiconductor optical amplifier (lasing SOA) which generates a ballast laser signal, and
  - at least one wavelength-sensitive detector coupled to receive the ballast laser signal from the lasing SOA; and
- a network management system coupled to the wavelength-sensitive detector(s) for determining whether a wavelength-sensitive detector has detected a shift in wavelength of the ballast laser signal received by the wavelength-sensitive detector.

31. The node of claim 30 wherein the shift in wavelength is a shift to a longer wavelength.

32. The node of claim 30 wherein the wavelength-sensitive detector comprises:
- an optical filter coupled to receive the ballast laser signal, wherein the optical filter has a pass band and a stop band and an edge between the pass band and the stop band is located between an operating wavelength of the ballast laser signal and a wavelength of the ballast laser signal after the shift in wavelength; and
- a detector coupled to the optical filter.

33. The node of claim 30 wherein the lasing SOA comprises a vertical lasing SOA.

34. A method for detecting early warning of failure of an optical amplifier, the method comprising:
- pumping a lasing semiconductor optical amplifier (lasing SOA) above a lasing threshold for the lasing SOA, whereby the lasing SOA generates a ballast laser signal; and
- monitoring a conversion efficiency with which the pumping is converted to the ballast laser signal.

35. The method of claim 34 wherein:
- pumping the lasing SOA comprises pumping the lasing SOA at a constant level; and
- monitoring the conversion efficiency comprises monitoring the ballast laser signal for a decrease in strength.

36. The method of claim 34 wherein:
- pumping the lasing SOA comprises pumping the lasing SOA to maintain the ballast laser signal at a constant level; and
- monitoring the conversion efficiency comprises monitoring the pumping for an increase in pumping.

37. The method of claim 34 wherein the lasing SOA comprises a vertical lasing SOA.

* * * * *